(12) United States Patent
Watanabe et al.

(10) Patent No.: US 11,201,279 B2
(45) Date of Patent: Dec. 14, 2021

(54) PIEZOELECTRIC MATERIAL, PIEZOELECTRIC ELEMENT, VIBRATION WAVE MOTOR, OPTICAL APPARATUS, AND ELECTRONIC APPARATUS

(71) Applicant: CANON KABUSHIKI KAISHA, Tokyo (JP)

(72) Inventors: Tomohiro Watanabe, Yokohama (JP); Makoto Kubota, Yokohama (JP); Akira Uebayashi, Tokyo (JP); Kanako Oshima, Tokyo (JP); Tatsuo Furuta, Machida (JP)

(73) Assignee: CANON KABUSHIKI KAISHA, Tokyo (JP)

(*) Notice: Subject to any disclaimer, the term of this patent is extended or adjusted under 35 U.S.C. 154(b) by 806 days.

(21) Appl. No.: 16/051,605

(22) Filed: Aug. 1, 2018

(65) Prior Publication Data

US 2019/0044054 A1    Feb. 7, 2019

(30) Foreign Application Priority Data

Aug. 2, 2017 (JP) .............. JP2017-149962
Jul. 30, 2018 (JP) .............. JP2018-142935

(51) Int. Cl.
*H01L 41/18* (2006.01)
*H01L 41/09* (2006.01)
(Continued)

(52) U.S. Cl.
CPC .............. *H01L 41/09* (2013.01); *B32B 18/00* (2013.01); *C04B 35/4682* (2013.01); *C04B 35/62695* (2013.01); *C04B 35/63416* (2013.01); *H01L 41/0471* (2013.01); *H01L 41/0472* (2013.01); *H01L 41/083* (2013.01); *H01L 41/1871* (2013.01); *H01L 41/43* (2013.01); *H02N 2/106* (2013.01); *H02N 2/163* (2013.01); *C04B 2235/3206* (2013.01);
(Continued)

(58) Field of Classification Search
CPC ... H01L 41/09; H01L 41/0471; H01L 41/083; H01L 41/1871; H01L 41/0472
See application file for complete search history.

(56) References Cited

U.S. PATENT DOCUMENTS 7,944,126 B2   5/2011  Tanaka et al.
8,182,713 B2   5/2012  Xiaobing et al.
(Continued)

FOREIGN PATENT DOCUMENTS

JP    2009215111 A   9/2009
JP    2010120835 A   6/2010

*Primary Examiner* — J. San Martin
(74) *Attorney, Agent, or Firm* — Rossi, Kimms & McDowell LLP

(57) ABSTRACT

A piezoelectric material which is low in load on the environment, and also satisfies both the requirements of a high piezoelectric constant and a high mechanical quality factor. The piezoelectric material comprises a plurality of crystal grains containing Ba, Ca, Ti, Zr, Mn, and O. An average equivalent circle diameter of the crystal grains is not smaller than 1.0 μm and not larger than 10 μm. The crystal grains include crystal grains A each having a first domain with a width of not smaller than 300 nm and not larger than 800 nm, and crystal grains B each having a second domain with a width of not smaller than 20 nm and not larger than 50 nm.

13 Claims, 21 Drawing Sheets

(51) Int. Cl.
*H01L 41/047* (2006.01)
*C04B 35/468* (2006.01)
*H01L 41/187* (2006.01)
*H01L 41/083* (2006.01)
*B32B 18/00* (2006.01)
*C04B 35/634* (2006.01)
*C04B 35/626* (2006.01)
*H01L 41/43* (2013.01)
*H02N 2/10* (2006.01)
*H02N 2/16* (2006.01)
*H04N 5/225* (2006.01)
*G02B 7/10* (2021.01)

(52) U.S. Cl.
CPC .. *C04B 2235/3208* (2013.01); *C04B 2235/40* (2013.01); *C04B 2235/5445* (2013.01); *C04B 2235/604* (2013.01); *C04B 2235/6565* (2013.01); *C04B 2235/6567* (2013.01); *C04B 2235/6583* (2013.01); *C04B 2235/77* (2013.01); *C04B 2235/786* (2013.01); *C04B 2235/85* (2013.01); *G02B 7/102* (2013.01); *H04N 5/2254* (2013.01)

(56) References Cited

U.S. PATENT DOCUMENTS

| | | | |
|---|---|---|---|
| 9,412,931 B2* | 8/2016 | Shimada | C04B 35/62645 |
| 9,425,380 B2* | 8/2016 | Hayashi | B41J 2/14201 |
| 9,509,235 B2* | 11/2016 | Furuta | H01L 41/18 |
| 9,525,123 B2* | 12/2016 | Uebayashi | B06B 1/06 |
| 9,537,081 B2* | 1/2017 | Oshima | B06B 1/06 |

* cited by examiner

*FIG. 9*

TABLE 1

|  | SINTERING TIME (HOURS) |
|---|---|
| COMPARATIVE EXAMPLE 1 | 0.2 |
| EXAMPLE 1 | 3.8 |
| EXAMPLE 2 | 5.0 |
| EXAMPLE 3 | 7.5 |
| EXAMPLE 4 | 13.0 |
| EXAMPLE 5 | 18.0 |
| COMPARATIVE EXAMPLE 2 | 25.0 |

FIG. 10

TABLE 2

| | RELATIVE DENSITY (%) | AVERAGE EQUIVALENT CIRCLE DIAMETER (μm) | PRESENCE OF 1ST DOMAIN (LARGE) | PRESENCE OF 2ND DOMAIN (SMALL) | $|d_{31,\,RT}|$ (pm/V) | $Q_{m,\,RT}$ (—) |
|---|---|---|---|---|---|---|
| COMPARATIVE EXAMPLE 1 | 90.8 | 0.5 | PRESENT | PRESENT | 64 | 470 |
| EXAMPLE 1 | 95.0 | 1.0 | PRESENT | PRESENT | 88 | 602 |
| EXAMPLE 2 | 97.2 | 2.3 | PRESENT | PRESENT | 78 | 615 |
| EXAMPLE 3 | 98.5 | 4.8 | PRESENT | PRESENT | 75 | 627 |
| EXAMPLE 4 | 97.2 | 8.4 | PRESENT | PRESENT | 73 | 621 |
| EXAMPLE 5 | 95.1 | 10.0 | PRESENT | PRESENT | 70 | 610 |
| COMPARATIVE EXAMPLE 2 | 95.0 | 11.5 | PRESENT | PRESENT | 43 | 510 |

FIG. 11

TABLE 3

| | AVERAGE EQUIVALENT CIRCLE DIAMETER (μm) | S (min) | $|d_{31, RT}|$ (pm/V) | $Q_{m, RT}$ (—) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) |
|---|---|---|---|---|---|---|
| EXAMPLE 6 | 2.7 | 18 | 97 | 798 | 4.9 | 28.8 |
| EXAMPLE 7 | 2.8 | 16 | 92 | 800 | 5.8 | 26.7 |
| EXAMPLE 8 | 2.8 | 10 | 82 | 850 | 7.9 | 17.7 |
| EXAMPLE 9 | 2.8 | 3 | 80 | 951 | 9.1 | 5.3 |
| EXAMPLE 10 | 2.9 | 1 | 79 | 980 | 9.3 | 0.5 |

FIG. 12

TABLE 4

| | DC VOLTAGE APPLICATION TIME IN 2ND POLARIZATION TREATMENT (min) | $\|d_{31, RT}\|$ (pm/V) | $Q_{m, RT}$ (−) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) | PRESENCE OF CRYSTAL GRAINS EACH WITH BOTH OF 1ST AND 2ND DOMAINS |
|---|---|---|---|---|---|---|
| EXAMPLE 11 | 13 | 87 | 820 | 6.6 | 21.6 | ABSENT |
| EXAMPLE 12 | 5 | 91 | 904 | 8.4 | 27.2 | PRESENT |

FIG. 14

TABLE 5

| | DC VOLTAGE APPLICATION TIME IN 1ST POLARIZATION TREATMENT (min) | DC VOLTAGE APPLICATION TIME IN 2ND POLARIZATION TREATMENT (min) | $|d_{31,RT}|$ (pm/V) | $Q_{m,RT}$ (—) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) | PRESENCE OF 1ST DOMAIN EXTENDING OVER ADJACENT CRYSTAL GRAINS |
|---|---|---|---|---|---|---|---|
| EXAMPLE 13 | 35 | 6 | 97 | 964 | 9.8 | 29.7 | ABSENT |
| EXAMPLE 14 | 60 | 7 | 94 | 1128 | 11.5 | 28.0 | PRESENT |

FIG. 16

TABLE 6

| | x | SINTERING TEMPERATURE (°C) | $|d_{31, RT}|$ (pm/V) | $Q_{m, RT}$ (−) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) |
|---|---|---|---|---|---|---|
| EXAMPLE 15 | 0.02 | 1,340 | 181 | 620 | 8.7 | 62.7 |
| EXAMPLE 16 | 0.10 | 1,340 | 151 | 681 | 11.0 | 54.8 |
| EXAMPLE 17 | 0.14 | 1,340 | 138 | 728 | 12.3 | 48.7 |
| EXAMPLE 18 | 0.20 | 1,340 | 130 | 837 | 15.6 | 32.2 |
| EXAMPLE 19 | 0.23 | 1,370 | 127 | 912 | 17.0 | 22.4 |
| EXAMPLE 20 | 0.30 | 1,400 | 120 | 1105 | 19.1 | 10.6 |

FIG. 17

TABLE 7

| | $|d_{31, 10°C}|$ (pm/V) | $|d_{31, 40°C}|$ (pm/V) | $|d_{31, 40°C} - d_{31, 10°C}| / |d_{31, RT}|$ (−) |
|---|---|---|---|
| EXAMPLE 15 | 109 | 168 | 0.33 |
| EXAMPLE 16 | 179 | 138 | 0.27 |
| EXAMPLE 17 | 148 | 123 | 0.18 |
| EXAMPLE 18 | 82 | 77 | 0.06 |
| EXAMPLE 19 | 66 | 60 | 0.09 |
| EXAMPLE 20 | 54 | 52 | 0.04 |

FIG. 18

TABLE 8

| | y | $|d_{31, RT}|$ (pm/V) | $Q_{m, RT}$ (—) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) | $T_C$ (°C) |
|---|---|---|---|---|---|---|
| EXAMPLE 21 | 0.005 | 119 | 930 | 17.0 | 41.0 | 127 |
| EXAMPLE 22 | 0.010 | 120 | 922 | 16.9 | 43.1 | 125 |
| EXAMPLE 23 | 0.050 | 132 | 877 | 16.1 | 53.2 | 115 |
| EXAMPLE 24 | 0.095 | 154 | 839 | 15.2 | 59.3 | 100 |
| EXAMPLE 25 | 0.100 | 157 | 835 | 14.9 | 60.0 | 99 |

FIG. 19

TABLE 9

| | $z$ | $|d_{31, RT}|$ (pm/V) | $Q_{m, RT}$ (—) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) |
|---|---|---|---|---|---|
| EXAMPLE 26 | 0.002 | 137 | 1187 | 19.9 | 47.3 |
| EXAMPLE 27 | 0.003 | 135 | 1213 | 20.2 | 46.1 |
| EXAMPLE 28 | 0.006 | 133 | 1355 | 21.5 | 43.7 |
| EXAMPLE 29 | 0.008 | 133 | 1413 | 22.2 | 41.5 |
| EXAMPLE 30 | 0.012 | 132 | 1208 | 20.1 | 39.3 |
| EXAMPLE 31 | 0.013 | 130 | 1031 | 18.5 | 38.7 |

FIG. 20

TABLE 10

| | Bi/ (A+B) (mol%) | $|d_{31,\ RT}|$ (pm/V) | $Q_{m,\ RT}$ (−) | NUMBER DENSITY OF CRYSTAL GRAINS EACH WITH 1ST DOMAINS (LARGE) (% BY NUMBER) | NUMBER DENSITY OF CRYSTAL GRAINS EACH WITH 2ND DOMAINS (SMALL) (% BY NUMBER) | $Q_{m,\ -30°C}$ (−) |
|---|---|---|---|---|---|---|
| EXAMPLE 32 | 0.41 | 124 | 1297 | 19.8 | 18.7 | 490 |
| EXAMPLE 33 | 0.40 | 124 | 1312 | 22.8 | 18.8 | 485 |
| EXAMPLE 34 | 0.20 | 134 | 1425 | 48.2 | 22.3 | 384 |
| EXAMPLE 35 | 0.15 | 134 | 1383 | 51.1 | 21.8 | 352 |
| EXAMPLE 36 | 0.14 | 134 | 1372 | 51.7 | 21.6 | 349 |
| EXAMPLE 37 | 0 | 123 | 1303 | 19.8 | 18.7 | 238 |

FIG. 21

TABLE 11

| | a | SINTERING TEMPERATURE | RELATIVE DENSITY | $|d_{31, RT}|$ | $Q_{m, RT}$ | NUMBER DENSITY OF CRYSTAL GRAINS EACH WITH 1ST DOMAINS (LARGE) | NUMBER DENSITY OF CRYSTAL GRAINS EACH WITH 2ND DOMAINS (SMALL) | AVERAGE EQUIVALENT CIRCLE DIAMETER |
|---|---|---|---|---|---|---|---|---|
| | (—) | (°C) | (%) | (pm/V) | (—) | (% BY NUMBER) | (% BY NUMBER) | (μm) |
| EXAMPLE 38 | 0.9765 | 1,340 | 96.5 | 86 | 647 | 5.9 | 5.3 | 5.7 |
| EXAMPLE 39 | 0.9800 | 1,340 | 97.0 | 87 | 654 | 6.4 | 8.8 | 5.6 |
| EXAMPLE 40 | 0.9955 | 1,340 | 97.8 | 96 | 694 | 8.3 | 22.9 | 4.9 |
| EXAMPLE 41 | 1.0100 | 1,480 | 96.8 | 90 | 628 | 5.5 | 14.1 | 4.2 |
| EXAMPLE 42 | 1.0133 | 1,570 | 96.4 | 89 | 619 | 5.3 | 10.6 | 4.1 |

PIEZOELECTRIC MATERIAL, PIEZOELECTRIC ELEMENT, VIBRATION WAVE MOTOR, OPTICAL APPARATUS, AND ELECTRONIC APPARATUS

BACKGROUND OF THE INVENTION

Field of the Invention

The present invention relates to a piezoelectric material containing no lead, as well as a piezoelectric element, a vibration wave motor, an optical apparatus, and an electronic apparatus, each using the piezoelectric material.

Description of the Related Art

Lead zirconate titanate (PZT) containing lead is a typical piezoelectric material, and is used in various kinds of piezoelectric devices, including actuators, vibrators, sensors, and filters. However, elution of lead components contained in discarded piezoelectric material into soil can adversely affect the ecological system, and hence with a view to making piezoelectric devices free from lead, research and development of lead-free piezoelectric materials are being vigorously performed.

Incidentally, to make a piezoelectric device that operates at a high vibration speed, a piezoelectric material is required which satisfies both of the requirements of a high piezoelectric constant (e.g. $d_{31}$ or $d_{33}$) and a high mechanical quality factor $Q_m$.

As one of promising lead-free piezoelectric materials which are to be used in place of lead zirconate titanate, there may be mentioned a barium calcium zirconate titanate (hereinafter referred to as "BCTZ")-based lead-free piezoelectric material. Further, Japanese Laid-Open Patent Publication (Kokai) No. 2009-215111 discloses a barium titanate-based material as a lead-free piezoelectric material having an excellent piezoelectric constant. The barium titanate-based material has a composition of $\{[(Ba_{1-x1}M1_{x1})((Ti_{1-x}Zr_x)_{1-y1}N1_{y1})O_3]\text{-}\delta\%[((Ba_{1-y}Ca_y)_{1-x2}M2_{x2})(Ti_{1-y2}N2_{y2})O_3]\}$. Here, M1, N1, M2 and N2 represent additive elements, respectively. In this barium titanate-based material, a first end member $(Ba_{1-x1}M1_{x1})((Ti_{1-x}Zr_x)_{1-y1}N1_{y1})O_3$ has a rhombohedral crystal structure, while a second end member $((Ba_{1-y}Ca_y)_{1-x2}M2_{x2})(Ti_{1-y2}N2_{y2})O_3$ has a tetragonal crystal structure. The barium titanate-based material disclosed in Japanese Laid-Open Patent Publication (Kokai) No. 2009-215111 uses two components different in the crystal system as pseudo-binary system solid solution, and improves the piezoelectric constant $d_{33}$ by making use of an increase in the degree of freedom of a composition in the vicinity of a morphotropic phase boundary (hereinafter referred to as "MPB") in a polarization direction. For example, Japanese Laid-Open Patent Publication (Kokai) No. 2009-215111 discloses that the piezoelectric constant $d_{33}$ of $Ba(Ti_{0.8}Zr_{0.2})O_3$-50% $(Ba_{0.7}Ca_{0.3})TiO_3$ at 20° C. is 584 pC/N. Further, Japanese Laid-Open Patent Publication (Kokai) No. 2010-120835 discloses that to improve the mechanical quality factor $Q_m$ of barium titanate as a piezoelectric material at room temperature, a part of the A site of barium titanate is substituted by Ca, and a part of the B site of the same by Mn, Fe or Cu, which is an acceptor. Specifically, the mechanical quality factor $Q_m$ is improved by substituting the part of the B site by the acceptor to thereby cause formation of oxygen vacancies and thereby reduce ferroelectric domain wall mobility (pinning).

Incidentally, an increase in the degree of freedom of a composition in the vicinity of MPB in a polarization direction, as mentioned in Japanese Laid-Open Patent Publication (Kokai) No. 2009-215111, means that depolarization is easy to occur. For example, BCTZ-based lead-free piezoelectric material disclosed in Japanese Laid-Open Patent Publication (Kokai) No. 2009-215111 is a soft magnetic material which has a Curie temperature $T_C$ of lower than 110° C. This implies that the BCTZ-based lead-free piezoelectric material is high in elasticity loss during resonant driving, and hence this material cannot realize a high mechanical quality factor $Q_m$. Further, although the formation of oxygen vacancies and the reduction of ferroelectric domain wall mobility by substitution of the part of the B site by the acceptor improve the mechanical quality factor $Q_m$, the piezoelectric constant is not improved. In other words, barium titanate used in Japanese Laid-Open Patent Publication (Kokai) No. 2010-120835 cannot realize a high piezoelectric constant. Therefore, there have been no conventional lead-free piezoelectric material which satisfies both the requirements of a high piezoelectric constant and a high mechanical quality factor $Q_m$.

SUMMARY OF THE INVENTION

The present invention provides a piezoelectric material which is low in load on the environment, and also satisfies both the requirements of a high piezoelectric constant and a high mechanical quality factor. Further, the present invention provides a piezoelectric element, a vibration wave motor, an optical apparatus, and an electronic apparatus, which are excellent in driving characteristics.

In a first aspect of the present invention, there is provided a piezoelectric material comprising a plurality of crystal grains containing Ba, Ca, Ti, Zr, Mn, and O, wherein an average equivalent circle diameter of the crystal grains is not smaller than 1.0 µm and not larger than 10 µm, and wherein the crystal grains include crystal grains A each having a first domain with a width of not smaller than 300 nm and not larger than 800 nm, and crystal grains B each having a second domain with a width of not smaller than 20 nm and not larger than 50 nm.

In a second aspect of the present invention, there is provided a piezoelectric element including electrodes and a piezoelectric material member wherein a piezoelectric material forming the piezoelectric material member is the piezoelectric material according to the first aspect of the present invention.

In a third aspect of the present invention, there is provided a vibration wave motor including a vibration member having the piezoelectric element according to the second aspect of the present invention disposed therein, and a moving member.

In a fourth aspect of the present invention, there is provided an optical apparatus including a drive section, wherein the drive section includes the vibration wave motor according to the third aspect of the present invention.

In a fifth aspect of the present invention, there is provided an electronic apparatus including the piezoelectric element according to the second aspect of the present invention.

According to the present invention, it is possible to provide a piezoelectric material which is low in load on the environment, and also satisfies both the requirements of a high piezoelectric constant and a high mechanical quality factor. Further, according to the present invention, it is possible to provide a piezoelectric element, a vibration wave motor, an optical apparatus, and an electronic apparatus, which are excellent in driving characteristics.

Further features of the present invention will become apparent from the following description of exemplary embodiments (with reference to the attached drawings).

BRIEF DESCRIPTION OF THE DRAWINGS

FIG. 9 is a table 1 showing sintering time periods of Comparative Examples 1 and 2, and Examples 1 to 5.

FIG. 10 is a table 2 showing calculation results and measurement results of Comparative Examples 1 and 2, and Examples 1 to 5.

FIG. 11 is a table 3 showing calculation results and measurement results of Examples 6 to 10.

FIG. 12 is a table 4 showing calculation results and measurement results of Examples 11 and 12.

FIG. 14 is a table 5 showing calculation results and measurement results of Examples 13 and 14.

FIG. 16 is a table 6 showing calculation results and measurement results of Examples 15 to 20.

FIG. 17 is a table 7 showing other calculation results and measurement results of Examples 15 to 20.

FIG. 18 is a table 8 showing calculation results and measurement results of Examples 21 to 25.

FIG. 19 is a table 9 showing calculation results and measurement results of Examples 26 to 31.

FIG. 20 is a table 10 showing calculation results and measurement results of Examples 32 to 37.

FIG. 21 is a table 11 showing calculation results and measurement results of Examples 38 to 42.

DESCRIPTION OF THE EMBODIMENTS

Figure 1:
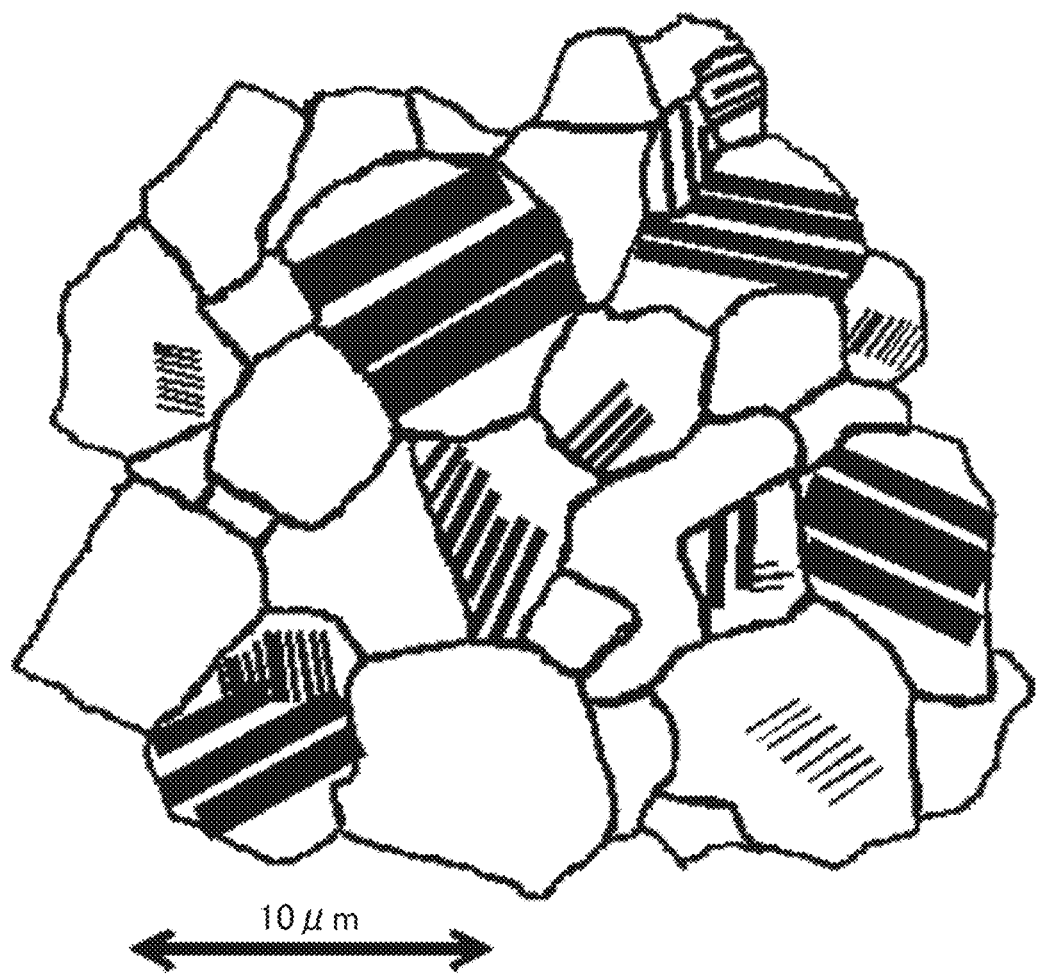
FIG. 1 is a schematic diagram useful in explaining domains of crystal grains appearing in a cross-section of a piezoelectric material according to the present invention.

The present invention will now be described in detail below with reference to the accompanying drawings showing embodiments thereof.

First, a piezoelectric material according to the present invention will be described. The piezoelectric material according to the present invention contains a plurality of crystal grains containing Ba, Ca, Ti, Zr, Mn, and O. In the piezoelectric material according to the present invention, an average equivalent circle diameter of crystal grains is not smaller than 1.0 µm and not larger than 10 µm. The piezoelectric material according to the present invention contains crystal grains A each having a first domain with a width of not smaller than 300 nm and not larger than 800 nm, and crystal gains B each having a second domain with a width of not smaller than 20 nm and not larger than 50 nm. The piezoelectric material is an aggregate of crystal grains, and each crystal grain contains elements composing the piezoelectric material. In the present invention, it is preferable that main components of the piezoelectric material are Ba, Ca, Ti, Zr, Mn, and O. That the main components of the piezoelectric material are Ba, Ca, Ti, Zr, Mn, and O means that analysis of composition of the piezoelectric material shows that six elements having higher molar abundance ratios are Ba, Ca, Ti, Zr, Mn, and O. Specifically, the piezoelectric material contains preferably not less than 90 mole %, more preferably not less than 98.5 mole %, in total, of Ba, Ca, Ti, Zr, Mn, and O. It is preferable that the piezoelectric material has a perovskite crystal structure. A metal oxide having a perovskite structure (perovskite-type metal oxide) is generally expressed by a chemical formula of $ABO_3$. In the perovskite-type metal oxide, element A and element B in the form of ions occupy particular positions in a unit cell of the perovskite structure, the positions being each called the A-site and the B-site. For example, in a unit cell of a cubic crystal system, element A is located at vertices of the cube and element B is located at the body-centered position of the cube. Element O is present in the form of anions of oxygen and occupies face-centered positions of the cube. When the unit cell is distorted toward the coordinates of (001), (011) or (111) of the cubic crystal system, the unit cell is formed into a unit cell of a crystal lattice that has a perovskite structure of a crystal system, such as a tetragonal, an orthorhombic, or a rhombohedral.

Now, the piezoelectric material containing the plurality of crystal grains containing Ba, Ca, Ti, Zr, Mn, and O can be expressed using a chemical formula of the perovskite-type metal oxide by the following formula (1):

$$(Ba_{1-x}Ca_x)_a(Ti_{1-y-z}Zr_yMn_z)O_3 \quad (1)$$

In the above formula (1), x represents a ratio of the content (mole) of Ca to A (mole) which is the sum of the contents of Ba and Ca, and y represents a ratio of the content (mole) of Zr to B (mole) which is the sum of the contents of Ti, Zr, and Mn. Further, in the above formula (1), z represents a ratio of the content (mole) of Mn to B (mole), and a represents a molar ratio (A/B) between A (mole) and B (mole). The above formula (1) expresses a metal oxide in which Ba and Ca are metal elements at the A site, while Ti, Zr, and Mn are metal elements at the B site. However, some of Ba and Ca may be at the B site. Similarly, some of Ti, Zr, and Mn may be at the A site. In the above formula (1), the molar ratio between the elements at the B site and the element O is 1 to 3. However, even in a case where the ratio (molar ratio) between the amounts of elements deviates to some degree, e.g. within a range of 1%, insofar as the metal oxide has a perovskite structure as a main phase, the piezoelectric material is also covered by the scope of the present invention. Whether the metal oxide has a perovskite structure can be determined e.g. by X-ray diffractometry or electron diffractometry performed on the piezoelectric material. Insofar as the perovskite structure is a main crystalline phase (main phase of the metal oxide), even if the piezoelectric material contains other crystalline phases as secondary phases, the piezoelectric material is covered by the scope of the present invention. Further, in the present invention, crystal grains of piezoelectric material containing Ba, Ca, Ti, Zr, Mn, O have an average equivalent circle diameter of not smaller than 1.0 μm and not larger than 10 μm. By limiting the average equivalent circle diameter of the crystal grains within this range, the piezoelectric material according to the present invention has an excellent mechanical quality factor $Q_m$ and mechanical strength. In the present invention, the term "equivalent circle diameter of a crystal grain" refers to a "projected area equivalent circle diameter" which is generally known in microscopy, and represents the diameter of a perfect circle having the same area as the projected area of the crystal grain observed using an SEM (scanning electron microscope) or the like. In the present invention, the method for measuring this equivalent circle diameter is not particularly limited. For example, the diameter of a crystal grain may be determined by subjecting a piezoelectric material to processing based on a sample preparation method of Japanese Industrial Standards (hereinafter referred to as JIS) R 1633 or the like, then observing a cross-sectional surface of the resulting piezoelectric material based on JIS R 1670 or the like by using a polarizing microscope, the SEM or the like to obtain a photograph image of the cross-sectional surface, and then subjecting the photograph image to image processing. Since the optimum magnification differs depending on the grain size to be analyzed, an optical microscope or an electron microscope may be selectively used. An average of equivalent circle diameters determined on all crystal grains within a field of view of observation, except crystal grains outside the field of view of observation, is an average equivalent circle diameter. It is difficult to calculate equivalent circle diameters of all metal oxide crystal grains of the piezoelectric material. However, based on JIS Z 8827-1 or the like, the average equivalent circle diameter is calculated by adjusting the size, observed area, and number of fields of view of observation, such that equivalent circle diameters in a correct grain diameter distribution can be obtained.

Incidentally, when the average equivalent circle diameter is larger than 1.0 μm, the square distortion of the crystal structure of the piezoelectric material increases, and hence it is considered that this increases the dielectric constant and the piezoelectric constant. Further, when the average equivalent circle diameter is larger than 1.0 μm, the proportion of internal loss ascribable to crystal grain boundaries or boundaries between domains (referred to as domain walls or boundary walls) becomes smaller than that of the dielectric loss tan δ. It is considered that this results in a suitable magnitude of the mechanical quality factor $Q_m$ of the piezoelectric material. In general, the mechanical quality factor $Q_m$ refers to a coefficient indicative of an elasticity loss caused by vibration when the piezoelectric material is evaluated as a vibrator, and the magnitude of the mechanical quality factor $Q_m$ is observed as a sharpness of a resonance curve in an impedance measurement. That is, the mechanical quality factor $Q_m$ is a constant that represents the sharpness of the resonance of the vibrator. When the mechanical quality factor $Q_m$ is high, energy lost by vibration is small. When the insulation properties and the mechanical quality factor $Q_m$ of a piezoelectric material are improved, it is possible to ensure long-term reliability of a piezoelectric element which uses the piezoelectric material and is driven by applying a voltage thereto. Note that the mechanical quality factor $Q_m$ can be measured by a measurement method of EM-4501A, which is a standard defined by Electronics and Information Technology Industries Association. Further, generally, the domain is also referred to as a magnetic domain, and refers to a region observed e.g. by SEM or the like as a zone (stripe) in a crystal grain, in which the direction of spontaneous polarization is uniform. Further, the term domain used in the present specification has the same meaning as a domain structure or a domain aggregate. In general, in the piezoelectric material, the inverse of $Q_m$ ($Q_m^{-1}$) represents an internal loss, and it is assumed that the internal loss is proportional to the dielectric loss (tangent δ). The internal loss of a ferroelectric material is expressed by the following formula (2):

$$Q_m^{-1} = C(Q_{m(SD)}^{-1} + k^2 \tan \delta_{(SD)} + Q_{m(Ce)}^{-1}) \qquad (2)$$

In the above formula (2), $Q_{m(SD)}^{-1}$ represents an intrinsic internal loss of one domain, and $Q_{m(Ce)}^{-1}$ represents an internal loss ascribable to the structure (grain boundary, domain wall) of the ferroelectric material. Further, $\tan \delta_{(SD)}$ represents an intrinsic dielectric loss of one domain, while k is an electromechanical coupling coefficient of one domain, and C is a constant.

In general, in the above formula (2), $Q_{m(SD)}^{-1}$ and $Q_{m(Ce)}^{-1}$ are both negligibly low, and the dielectric loss (tan δ) of the ferroelectric material is proportional to $\tan \delta_{(SD)}$, and hence it is explained that $Q_m^{-1}$ is proportional to tan δ. However, if the average equivalent circle diameter of crystal grains is smaller than 1.0 μm, $Q_{m(Ce)}^{-1}$ becomes too high to be negligible, and hence it is considered that the mechanical quality factor $Q_m$ becomes low. Further, if the average equivalent circle diameter of crystal grains is smaller than 10 μm, the binding between crystal grains increases, which improves the density and mechanical strength of the piezoelectric material. The density of the piezoelectric material can be measured by the Archimedes method. Here, if a ratio of an actually measured density ($\rho_{meas.}$) to a theoretical density ($\rho_{calc.}$) calculated based on the composition and lattice constant of the piezoelectric material, i.e. a relative density ($\rho_{calc.}/\rho_{meas.}$) is not lower than 95%, it is considered that the piezoelectric material is sufficiently closely packed.

Furthermore, the piezoelectric material according to the present invention contains both of crystal grains A each having a first domain with a width of not smaller than 300 nm and not larger than 800 nm, and crystal grains B each having a second domain with a width of not smaller than 20 nm and not larger than 50 nm. The first domain and the second domain may be present in the same crystal grain of the piezoelectric material, or may be present in different crystal grains, respectively.

FIG. 1 is a schematic diagram of domains in crystal grains appearing in a cross-sectional surface of the piezoelectric material according to the present invention. In FIG. 1, each domain is represented by a stripe, and the width of a domain which is present in the piezoelectric material according to the present invention (hereinafter simply referred to as "domain of the present invention") corresponds to the length of a short side of each stripe. The width of the domain can be measured using a photograph image taken on a cross-sectional surface of a piezoelectric material prepared by a sample preparation method of JIS R 1633 or the like, which is observed by SEM. To observe the domain of the present invention by SEM, it is preferable to polish the cross-sectional surface of the piezoelectric material into a mirror-surface state, and form a thin conductive film on the cross-sectional surface by vapor deposition. An SEM detector used in the present invention for domain observation is a secondary electron detector or a reflection electron detector.

It is known that in general, the mechanical quality factor $Q_m$ and the piezoelectric constant are in a trade-off relationship, and as the mechanical quality factor $Q_m$ increases, the piezoelectric constant decreases, whereas as the mechanical quality factor $Q_m$ decreases, the piezoelectric constant increases. However, according to the present invention, the trade-off relationship between the mechanical quality factor $Q_m$ and the piezoelectric constant is eliminated by adjusting the width of domains in crystal grains contained in the piezoelectric material, to thereby provide a piezoelectric material meeting both the requirements of a high piezoelectric constant (especially, the high absolute value of the piezoelectric constant $d_{31}$) and a high mechanical quality factor $Q_m$. Specifically, the piezoelectric material according to the present invention simultaneously contains crystal grains A each having a first domain contributing to an increase in the mechanical quality factor $Q_m$ and crystal grains B each having a second domain contributing to an increase in the absolute value of the piezoelectric constant $d_{31}$. In the second domain, domain inversion relatively easily occurs, and hence it is considered that crystal grains B each having the second domain enter between crystal grains A each having the first domain to thereby reduce the stress and distortion between the crystal grains. With this, in the piezoelectric material according to the present invention, the absolute value of the piezoelectric constant $d_{31}$ is increased.

Now, let us consider a case where in a piezoelectric material including crystal grains each containing Ba, Ca, Ti, Zr, Mn, and O, and having an average equivalent circle diameter of not smaller than 1.0 μm and not larger than 10 μm, the width of the second domain is not larger than 50 nm. In this case, the density of 90° domain walls high in electric field responsiveness increases. As a result, it is considered that the dielectric constant of the piezoelectric material increases to increase the absolute value of the piezoelectric constant $d_{31}$ thereof. Next, let us consider a case where the width of the second domain is not smaller than 20 nm. In this case, it is considered that the crystal structure of each crystal grain becomes stable to increase remanence, and that as a result, the absolute value of the piezoelectric constant $d_{31}$ becomes a suitable value for the piezoelectric material. In view of this, according to the present invention, the width of the second domain is set to be not smaller than 20 nm and not larger than 50 nm. In general, the piezoelectric constant $d_{31}$ of the piezoelectric material can be determined from a resonance frequency and an anti-resonance frequency determined by measurement using a commercially available impedance analyzer, by calculation based on the standard (EM-4501A) defined by Electronics and Information Technology Industries Association (JEITA). Hereinafter, this calculation method of the piezoelectric constant $d_{31}$ is referred to as "the resonance and anti-resonance method". Note that if the absolute value of the piezoelectric constant $d_{31}$ is lower than 10 pm/V, it is necessary to supply high power to a piezoelectric device including the piezoelectric material for driving the piezoelectric device. It is preferable that the absolute value of the piezoelectric constant $d_{31}$ of a piezoelectric material is not lower than 50 pm/V, and in particular, if the absolute value of the piezoelectric constant $d_{31}$ becomes not lower than 80 pm/V, the power consumption during driving of the piezoelectric device is suppressed to make the piezoelectric material suitable for practical use. Further, if the absolute value of the piezoelectric constant $d_{31}$ is not lower than 90 pm/V, the piezoelectric device has a better performance.

Further, let us consider a case where in crystal grains each containing Ba, Ca, Ti, Zr, Mn, and O and having an average equivalent circle diameter of not smaller than 1.0 μm and not larger than 10 μm, the width of the first domain is not larger than 800 nm. In this case, it is considered that residual stress between crystal grains caused by non-180° domain switching is reduced to increase the mechanical quality factor $Q_m$. Next, let us consider a case where the width of the first domain is not smaller than 300 nm. In this case, it is considered a decrease in the internal loss ascribable to grain boundaries and domain walls increases the mechanical quality factor $Q_m$. In view of this, according to the present invention, the width of the first domain is set to be not smaller than 300 nm and not larger than 800 nm. Incidentally, if the value of the mechanical quality factor $Q_m$ is lower than 600, the power consumption during driving of a resonance device including a piezoelectric element formed of the piezoelectric material increases. Therefore, it is preferable that the value of the mechanical quality factor $Q_m$ of the piezoelectric material according to the present invention is not lower than 600. In particular, it is more preferable that the value of the mechanical quality factor $Q_m$ is not lower than 800 nm, because this prevents occurrence of a very large increase in the power consumption. Furthermore, if the value of the mechanical quality factor $Q_m$ is not lower than 1000, the piezoelectric element has an excellent performance.

In the present embodiment of the invention, the expression "having a first domain" means that at least one domain with a width of not smaller than 300 nm and not larger than 800 nm is present in a single crystal grain, under the aforementioned microscope observation. The expression "having a second domain" means that at least one domain with a width of not smaller than 20 nm and not larger than 50 nm is present in a single crystal grain, under the aforementioned microscope observation. The expression "the crystal grains A each having the first domain is present in an amount of not less than 5% by number" means that "at least 5 crystal grains A each with a width of not smaller than 300 nm and not larger than 800 nm are present per 100 crystal grains as a total number of crystal grains within a field of view of the aforementioned microscope observation. Further, the expression "the crystal grains B each having the second domain is present in an amount of not less than 5% by number" means that "at least 5 crystal grains B each with a width of not smaller than 20 nm and not larger than 50 nm are present per 100 crystal grains as a total number of crystal grains within a field of view of the aforementioned microscope observation.

As described above, if the width of domains is not smaller than 300 nm and not larger than 800 nm, it is considered that the mechanical quality factor $Q_m$ is high, while if the width of domains is not smaller than 20 nm and not larger than 50 nm, it is considered that the absolute value of the piezoelectric constant $d_{31}$ is high. In view of this, the piezoelectric material according to the present invention is configured such that in the crystal grains each containing Ba, Ca, Ti, Zr, Mn, and O, the crystal grains A each having the first domain are present in an amount of not less than 5% by number, and the crystal grains B each having the second domain are present in an amount of not less than 5% by number. This makes it possible to form the piezoelectric material such that the number of crystal grains contributing to an increase of the mechanical quality factor $Q_m$ is increased and the number of crystal grains contributing to an increase of the absolute value of the piezoelectric constant $d_{31}$ is increased, whereby it is possible to obtain a suitable piezoelectric material in which the mechanical quality factor $Q_m$ is not lower than 800 and the absolute value of the piezoelectric constant $d_{31}$ is not lower than 80 pm/V. In particular, it is more preferable that the crystal grains B each having the second domain are present in an amount of not less than 10% by number and not more than 50% by number of the crystal grains each containing Ba, Ca, Ti, Zr, Mn, and O, since the absolute value of the piezoelectric constant $d_{31}$ of the piezoelectric material according to the present invention is higher. Also, it is more preferable that the crystal grains A each having the first domain are present in an amount of not less than 10% by number but not more than 50% by number of the crystal grains each containing Ba, Ca, Ti, Zr, Mn, and O, since the mechanical quality factor $Q_m$ of the piezoelectric material according to the present invention is higher. When counting the number of crystal grains A each having the first grain and the number of crystal grains B each having the second domain, it is desirable to improve the accuracy of counting by observing a larger number of crystal grains. Specifically, it is desirable to perform domain width measurement on at least 200 crystal grains, particularly on not less than 1000 crystal grains, to thereby count the number of crystal grains A each having the first domain and the number of crystal grains B each having the second domain.

Let us also consider a case where a first domain and a second domain are included in the same crystal grain. In this case, the increase in the mechanical quality factor $Q_m$ and the increase in the absolute value of the piezoelectric constant $d_{31}$ occur with more synergistic effects. In view of this, in the present invention, it is preferable that the crystal grains of the piezoelectric material include crystal grains each having both of the first domain and the second domain. In particular, it is more preferable that the piezoelectric material contains the crystal grains each having both of the first domain and the second domain in an amount of not less than 5% by number, since the mechanical quality factor $Q_m$ and the absolute value of the piezoelectric constant $d_{31}$ thereof both become higher. The expression "crystal grains each having both of the first domain and the second domain" means that at least one domain having a width of not smaller than 300 nm and not larger than 800 nm and at least one domain having a width of not smaller than 20 nm and not larger than 50 nm are present in each same crystal grain. A crystal grain A having the first domain may also have the second domain, and a crystal grain B having the second domain may also have the first domain. Further, let us consider a case where the first domains in the piezoelectric material include ones each extending across a grain boundary between adjacent crystal grains. In this case, residual stress between the adjacent crystal grains caused by non-180° domain switching is reduced to reduce the internal loss ascribable to the grain boundary. This increases the effect of increasing the mechanical quality factor $Q_m$. In view of this, in the present invention, it is preferable that the first domains include ones each extending across a grain boundary between adjacent crystal grains. The expression "the first domains include ones each extending across a grain boundary between adjacent crystal grains" implies that, within a field of view of observation, a domain having a width of not smaller than 300 nm and not larger than 800 nm is present in two or more crystal grains by extending across a grain boundary therebetween while maintaining substantially the same domain width. At this time, the domain is present in the two or more crystal grains with the same direction of dielectric polarization. Further, let us consider a case where the content of a Pb component contained in the piezoelectric material is less than 1000 ppm. In this case, it is possible to reduce the possibility of the Pb component in the piezoelectric material adversely affecting the environment, even when the piezoelectric material or an element or device using the piezoelectric material is discarded and exposed to acid rain, or is left unattended in a harsh environment. Therefore, it is preferable that in the piezoelectric material according to the present invention, the content of a Pb component is less than 1000 ppm.

Next, the composition of the piezoelectric material according to the present invention will be described. First, let us consider a case where the piezoelectric material contains Ca. In this case, a phase transition temperature ($T_{to}$) from the tetragonal to the orthorhombic during temperature decrease and a phase transition temperature ($T_{ot}$) from the orthorhombic to the tetragonal during temperature increase are lowered. In particular, in a case where the value of x which is a ratio of the content (mole) of Ca to the sum A (mole) of the contents of Ba and Ca is not lower than 0.02 and not higher than 0.10, the phase transition temperatures $T_{to}$ and $T_{ot}$ are close to room temperature. Further, when the temperature is room temperature or thereabound (e.g. 0° C. to 40° C.), the piezoelectric material shows a high absolute value (e.g. not lower than 150 pm/V) of the piezoelectric constant $d_{31}$. If the value of x is higher than 0.10, the phase transition temperatures $T_{to}$ and $T_{ot}$ become lower than 0° C., and the temperature dependency of the piezoelectric constant is reduced. On the other hand, if the value of x is lower than 0.30, the solid dissolution of Ca is promoted, whereby it is possible to lower sintering temperature. In view of this, in the present invention, it is more preferable that the value of x in the above formula (1) is 0.02≤x≤0.30.

Incidentally, as the temperature of the piezoelectric material according to the present invention rises from low temperature, the piezoelectric material undergoes phase transition in the sequence of the rhombohedral, the orthorhombic, the tetragonal, and the cubic. The phase transition in the embodiment refers to simply from the orthorhombic to the tetragonal, or from the tetragonal to the orthorhombic. The phase transition temperature can be evaluated by the same measurement method as applied to measurement of a Curie temperature $T_C$, referred to hereinafter, and in the present embodiment, a temperature at which a value obtained by differentiating the dielectric constant with respect to sample temperature becomes maximum is defined as the phase transition temperature. The crystal system can be evaluated by X-ray diffractometry, electron diffractometry, Raman scattering, or the like. Around the phase transition temperature, the dielectric constant and the electromechanical coupling factor k become maximum, and the Young's modulus of elasticity becomes minimum. The piezoelectric constant is a function of these three parameters, and shows a maximum value or an inflection point at or around the phase transition temperature. Here, as far as the phase transition temperature is concerned, if it is far from an operating temperature range of the piezoelectric device, e.g. not lower than −50° C. and not higher than −10° C., the temperature dependency of the piezoelectric performance in the operating temperature range is reduced, and hence this is more preferable from the viewpoint of control of the device.

However, as mentioned above, the piezoelectric constant shows a maximum value at or around the phase transition temperature, and hence it is desirable that the requirements of controllability of the device and the high piezoelectric constant are both met by controlling the relationship between the phase transition temperature and the operating temperature range, through the composition of the piezoelectric material. From this viewpoint, it is more preferable that x is not higher than 0.20, because in this case, the piezoelectric constant is high and the temperature dependency of the piezoelectric performance is suppressed.

In the present embodiment, the temperature dependency of the piezoelectric constant $d_{31}$ and the mechanical quality factor $Q_m$ of the piezoelectric element may be measured by the resonance and anti-resonance method as follows: Specifically, the piezoelectric element is placed in a thermostat bath, and while changing ambient temperature, the piezoelectric constant $d_{31}$ and the mechanical quality factor $Q_m$ of the piezoelectric element are measured by the resonance and anti-resonance method. The temperature change rate is not particularly limited but may be changed at a rate of 1 to 10° C./minute. It is preferable that after changing the ambient temperature, the ambient temperature is temporarily held constant until the temperature of the piezoelectric element follows up to the ambient temperature, and then the piezoelectric constant and the electromechanical quality factor are measured by the resonance and anti-resonance method, because results of measurement obtained by following the above procedure are high in reproducibility. Time over which the ambient temperature is held constant is not particularly limited, but it is preferable to hold the ambient temperature for 1 to 10 minutes.

Further, let us consider a case where the piezoelectric material contains Zr. In this case the phase transition temperatures $T_{to}$ and $T_{ot}$ rise. Particularly, by setting the value of y which is a ratio (molar ratio) of the number of moles of Zr to the sum of the numbers of moles of Ti, Zr, and Mn in the above formula (1) to not lower than 0.01, the phase transition temperatures $T_{to}$ and $T_{ot}$ are close to room temperature, and the piezoelectric constant in the operating temperature range (e.g. −30° C. to 60° C.) is increased. As a result, it is possible to reduce power required for driving a piezoelectric element, a piezoelectric element having a layered structure, a vibration wave motor, an optical apparatus, an electronic apparatus, and so forth, which uses the piezoelectric material. On the other hand, by setting the value of y to not higher than 0.095, the Curie temperature $T_C$ becomes as high as not lower than 100° C. to more suppress the depolarization when used under high temperatures, so that the operation assurance temperature range of the piezoelectric device becomes wider and the aging degradation of the piezoelectric constant is reduced. In view of this, in the present invention, it is more preferable that the value of y in the above formula (1) is $0.01 \leq y \leq 0.095$. The Curie temperature $T_C$ is a temperature at or above which the piezoelectric properties of the piezoelectric material are lost. In the present embodiment, a temperature at which the dielectric constant is maximum in the vicinity of the phase transition temperature between the ferroelectric phase (tetragonal phase) and the paraelectric phase (cubic phase) is defined as the Curie temperature $T_C$. The dielectric constant is measured using an impedance analyzer by the parallel-plate capacitor method by applying an AC electric field with a frequency of 1 kHz and an electric field strength of 10 V/cm.

Next, let us consider a case where in the piezoelectric material according to the present invention, the Curie temperature $T_C$ is not lower than 100° C. In this case, under a harsh condition of 80° C. which can be assumed as a temperature within a vehicle compartment in summer, the piezoelectric material does not lose its piezoelectric properties but can maintain the same, and can have a stable piezoelectric constant and mechanical quality factor $Q_m$. In view of this, in the present invention, it is more preferable that the Curie temperature $T_C$ is not lower than 100° C. Further, let us consider z in the above formula (1), which is a ratio (molar ratio) of the number of moles of Mn to the sum of the numbers of moles of Ti, Zr, and Mn. Mn has a property that the value thereof varies between divalence and tetravalence, and servers to compensate for defects in charge balance of the piezoelectric material. If the value of z is not lower than 0.003, it is considered that the concentration of oxygen vacancies in the crystal lattice of the piezoelectric material increases, and residual stress between crystal grains caused by non-180° domain switching is reduced, which makes the value of the mechanical quality factor $Q_m$ higher. On the other hand, if the value of z is not higher than 0.012, this promotes solid dissolution of Mn, which makes it possible to increase the insulation resistance. In particular, if the value of z is in a range of $0.003 \leq z \leq 0.012$, the value of the mechanical quality factor $Q_m$ becomes not lower than 1200, and hence this is more preferable. In view of this, in the present invention, it is more preferable that the value z in the formula (1) is in the range of $0.003 \leq z \leq 0.012$. Here, Mn is not limited to metallic Mn, and may be included in the piezoelectric material as an Mn component, and how it is contained is not limited. For example, it may be at the B site as a solid solution, or may be included in grain boundaries. Also, Mn components may be included in the piezoelectric material in the form of metal, ion, oxide, metal salt, complex, or the like. Further, also from the viewpoint of insulation properties and ease of sintering, the presence of Mn is preferable. In general, although Mn can take a valance of 4+, 2+, and 3+, if the valance of Mn is lower than 4+, Mn is an acceptor. If Mn is present in a crystal having the perovskite structure as an acceptor, oxygen vacancies are formed in the crystal. If the oxygen vacancies form defect dipoles, it is possible to improve the mechanical quality factor $Q_m$ of the piezoelectric material. In view of this, in the present invention, it is preferable that the valence of Mn is lower than 4+. To cause Mn to be present with a valence of lower than 4+, it is preferable that an element with a valence of 3 is present at the A site. This preferable element with the valence of 3 is Bi. Here, the valence of Mn can be evaluated by measurement of the temperature dependency of the magnetic susceptibility.

In the present invention, if the piezoelectric material contains sub-components comprising Bi, the mechanical quality factor $Q_m$ of the piezoelectric material at low temperatures is improved, and hence this is more preferable. In particular, in the above formula (1), the content (mole) of Bi with respect to the sum of A (mole) and B (mole) is not less than 0.15% and not more than 0.40%, the mechanical quality factor $Q_m$ of the piezoelectric material at a low temperature range, e.g. at a temperature of −30° C. is e.g. as high as not lower than 350. This facilitates the control of the piezoelectric device using the piezoelectric material, at the low temperature range. Further, in the present invention, it is more preferable that the value of a which indicates a ratio of A content (mole) and B content (mole) is not lower than 0.98 and not higher than 1.01. If the value of a is not lower than 0.98 and not higher than 1.01, the piezoelectric material is easy to be closely packed, the mechanical strength is improved, and the temperature necessary for crystal grain growth is lowered to not higher than 1500° C. at which a common sintering furnace can sinter the present piezoelectric material.

Next, the form of the piezoelectric material according to the present invention will be described. The form of the piezoelectric material according to the present invention is not particularly limited, but may be any of ceramic, powder, single crystal, film, slurry, granulated powder, green compact, or the like. However, the form of the piezoelectric material is preferably a ceramic. In the present embodiment, the term "ceramic" refers to an aggregate (also referred to as bulk) of crystal grains that comprise a metal oxide as a basic component and are sintered by heat treatment, that is, a so-called polycrystal. The term "ceramic" also refers to a ceramic that has been processed after sintering.

Next, a method of manufacturing the piezoelectric material according to the present invention will be described. The method of manufacturing the piezoelectric material according to the present invention is not particularly limited, but the following description is given of a typical method.

First, raw material powders of the piezoelectric material according to the present invention will be described. As the method of manufacturing raw material powders of the piezoelectric material according to the present invention, it is possible to adopt a general method of sintering solid powders, such as oxides, carbonates, nitrates, and oxalates, which contain constituent elements, under normal pressure. The solid powders are metallic compounds, such as a Ba compound, a Ca compound, a Ti compound, a Zr compound, a Mn compound, and a Bi compound. In particular, if a mixture formed by using perovskite-type metal oxides for all of the Ba compound, the Ca compound, the Ti compound, the Zr compound, and the Mn compound is sintered, it is possible to obtain an advantageous effect of making crystal grains after sintering finer, whereby it is possible to further suppress cracking and tipping from occurring during working of the piezoelectric material and the piezoelectric element. Therefore, it is preferable to mix the Ba compound, the Ca compound, the Ti compound, the Zr compound, and the Mn compound, by using perovskite-type metal oxides for all of them. Here, examples of the Ba compound that can be used include barium oxide, barium carbonate, barium oxalate, barium acetate, barium nitrate, barium titanate, barium zirconate, and barium zirconate titanate. Examples of the Ca compound that can be used include calcium oxide, calcium carbonate, calcium oxalate, calcium acetate, calcium titanate, and calcium zirconate. Examples of the Ti compound that can be used include titanium oxide, barium titanate, barium zirconate titanate, and calcium titanate. Examples of the Zr compound that can be used include zirconium oxide, barium zirconate, barium zirconate titanate, and calcium zirconate. Examples of the Mn compound that can be used include manganese carbonate, manganese oxide, manganese dioxide, trimanganese tetraoxide, and manganese acetate. Examples of the Bi compound that can be used include bismuth oxide.

Note that in the present embodiment, a material for use in adjusting a in the above Formula (1), which represents a ratio of the sum of the numbers of moles of Ti, Zr, and Mn to the sum of the numbers of moles of Ba and Ca, is not particularly limited. The same effect of adjustment of a can be obtained by using any of the Ba compound, the Ca compound, the Ti compound, the Zr compound, and the Mn compound.

Next, a process for preparing granules for a green compact will be described. The method for granulating raw material powders of the piezoelectric material according to the present invention to obtain granules for a green compact is not particularly limited. Examples of a binder that can be used in granulation include polyvinyl alcohol (PVA), polyvinyl butyral (PVB), and acrylic resins. The amount of binder added is preferably 1 to 10 parts by weight relative to the amount of raw material powders of the piezoelectric material, and is more preferably 2 to 5 parts by weight from the viewpoint of increasing the density of a green compact. Granulation of raw material powders may be performed from a powder mixture formed by mechanically mixing powders of the Ba compound, the Ca compound, the Ti compound, the Zr compound, and the Mn compound, or may be performed after provisionally sintering these compounds at a temperature in a range of about 800 to 1300° C. Alternatively, after provisionally sintering the Ba compound, the Ca compound, the Ti compound, and the Zr compound, the Mn compound may be added together with a binder simultaneously. From the viewpoint that the grain diameter of the resulting granulated powder can be made more uniform, a spray dry method is most preferably employed.

Next, a process for preparing a green compact will be described. The method of preparing a green compact of the piezoelectric material according to the present invention is not particularly limited. The term "green compact" refers to a solid prepared by molding a raw material powder, a granulated powder, or a slurry. The green compact can be made by uniaxial pressing, cold hydrostatic pressure working, warm hydrostatic pressure working, casting, extrusion, or the like.

Next, a process for producing a piezoelectric material will be described. In the present invention, the piezoelectric material is produced by sintering. The method of sintering the piezoelectric material is not particularly limited. Examples of the sintering method include sintering with an electric furnace, sintering with a gas furnace, an electric heating method, a microwave sintering method, a millimeter wave sintering method, and hot isostatic pressing (HIP). Sintering with an electric furnace or gas may be conducted in a continuous furnace or a batch furnace. Further, the sintering temperature of the piezoelectric material in the sintering method described above is not particularly limited. The sintering temperature is only required to be a temperature at which the compounds react with each other and crystal growth sufficiently occurs. In particular, the sintering temperature is preferably not lower than 1,200° C. and not higher than 1,500° C., and more preferably not lower than 1,250° C. and not higher than 1,450° C. A piezoelectric material sintered within the above temperature range exhibits excellent piezoelectric performance. In order to stabilize the characteristics of the piezoelectric material obtained by sintering with high reproducibility, a sintering process may be conducted for 2 to 24 hours while the sintering temperature is kept constant within the above range. In doing this, a two-step sintering method may be employed. However, a method that does not include rapid temperature changes is preferably employed in view of productivity.

Next, a film of the piezoelectric material according to the present invention will be described. When the piezoelectric material according to the present invention is used as a film formed on a substrate, it is desirable that the piezoelectric material has a thickness of not smaller than 400 nm and not larger than 10 μm, more preferably, not smaller than 500 nm and not larger than 3 μm, because a piezoelectric material having a thickness of not smaller than 400 nm and not larger than 10 μm can provide an electromechanical conversion function sufficient for a piezoelectric element. The method of forming the film of the piezoelectric material is not particularly limited. For example, chemical solution deposition (CSD), a sol-gel method, metal organic chemical vapor deposition (MOCVD), sputtering, pulsed laser deposition (PLD), hydrothermal synthesis, or aerosol deposition (AD) can be employed. In particular, chemical solution deposition or sputtering can be most preferably employed because chemical solution deposition or sputtering can easily form a film having a large area. The substrate on which the piezoelectric material according to the present invention is formed can be a single-crystal substrate cut and polished along the (001) plane or (110) plane. The use of a single-crystal substrate cut and polished along a specific crystal plane can strongly orient the piezoelectric material film formed on the surface of the substrate in the same direction.

Figure 2:
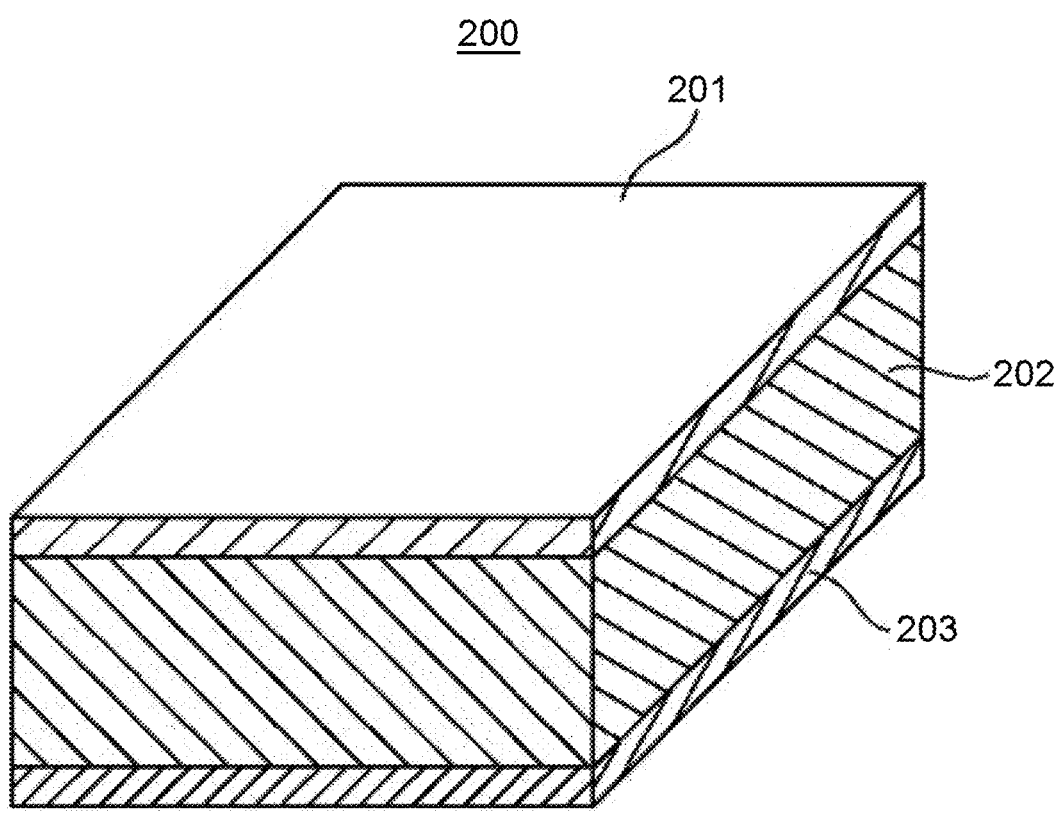
FIG. 2 is a partial perspective view of an example of a piezoelectric element according to an embodiment of the present invention.

Next, a piezoelectric element according to an embodiment of the present invention will be described. FIG. 2 is a partial perspective view of an example of the piezoelectric element according to the embodiment of the present invention. Referring to FIG. 2, the piezoelectric element, denoted by reference numeral 200, includes at least an upper electrode 201, a piezoelectric material member 202, and a lower electrode 203. In the piezoelectric element 200, the piezoelectric material according to the invention is used as a piezoelectric material constituting the piezoelectric material member 202. By using the piezoelectric material according to the present invention as the piezoelectric material constituting the piezoelectric material member 202, it is possible to evaluate the piezoelectric characteristics of the piezoelectric material. The upper electrode 201 and the lower electrode 203 are conductive layers having a thickness of about 5 nm to 10 μm. The material of the conductive layers is not particularly limited, but may be any material that is commonly used for the conductive layer of a piezoelectric element. Examples of the material include metals such as Ti, Pt, Ta, Ir, Sr, In, Sn, Au, Al, Fe, Cr, Ni, Pd, Ag, and Cu, and compounds thereof. The upper electrode 201 and the lower electrode 203 may be each made of any one of these metals and compounds or may be each a multilayer made of two or more of these materials. The upper electrode 201 and the lower electrode 203 may be made of different materials. The method of making the upper electrode 201 and the lower electrode 203 is not particularly limited, but the electrodes 201 and 203 may be formed by baking of a metal paste, sputtering, vapor deposition, or the like. Further, the upper electrode 201 and the lower electrode 203 may be each patterned into a desired shape.

Next, polarization treatment of the piezoelectric element according to the present invention will be described. A piezoelectric element having polarization axes aligned in the same direction has an enhanced piezoelectric constant, and hence it is preferable that the piezoelectric element has polarization axes aligned in the same direction. Whether a piezoelectric material or a piezoelectric element has polarization axes aligned in the same direction can be checked by checking whether residual stress is present therein through P-E (polarization-electric field) hysteresis measurement thereof. The polarization treatment method of the piezoelectric element according to the present invention is not particularly limited, insofar as it enables crystal grains A each having the first domain and crystal grains B each having the second domain to coexist. Further, the polarization treatment may be performed in the atmosphere or within silicone oil. The temperature at which the polarization treatment is performed is preferably from room temperature (e.g. 25° C.) to 150° C. However, the distribution of widths of domains present in the piezoelectric material before polarization and the effects of pinning the domain walls by oxygen vacancies caused by addition of Mn are different, depending on the composition and preparation method of the piezoelectric material constituting the piezoelectric element, and hence the optimum conditions for polarization are also different. In particular, as the polarization temperature is higher and the polarization treatment time period is longer, the domains tend to have larger widths. For example, if the width of most domains of the piezoelectric material before polarization already match the width of second domains, since the width of each domain is made larger as the polarization temperature is higher and the polarization treatment time is longer, the number of second domains decreases. In particular, if the polarization temperature is too high or the polarization treatment time period is too long, the widths of domains become too large, and hence the second domains may disappear. On the other hand, if the polarization temperature is too low or the polarization treatment time period is too short, the growth of domains is suppressed, and hence although the second domains sufficiently remain to be present, and the first domains may hardly grow.

In a case where only the polarization time period and the polarization temperature are used as the parameters of polarization, the width of each domain basically increases with the polarization time period and the polarization temperature, and hence it is difficult to control polarization such that crystal grains A each having the first domain and crystal grains B each having the second domain are caused to coexist. Therefore, it is preferable to control polarization using other parameters than the polarization time period and the polarization temperature. For example, it is possible to envisage the following process: In a first polarization treatment, a DC voltage is applied to the piezoelectric element at a temperature around the Curie temperature $T_C$ to cause first domains to grow, and thereafter the piezoelectric element is once cooled to stabilize the first domains. Subsequently, in a second polarization treatment, a weak DC voltage or a pulse-like voltage is applied to the piezoelectric element in an opposite direction to the direction of application of the DC voltage in the first polarization treatment at a temperature in a range of room temperature to lower than 80° C. for a short time period, to cause second domains to grow. In this case, it is preferable that in the first polarization treatment, an electric field having an electric field strength of 800 V/mm to 2.0 kV/mm is applied, whereas in the second polarization treatment, an electric field is applied using a voltage lower than the above. For example, the electric field applied in the second polarization treatment is properly adjusted in combination with the polarization time period and the polarization temperature such that a desired number of second domains are formed in a desired distribution. Further, it is possible to envisage another process: For example, in a first polarization treatment, a relatively low DC voltage (e.g. for an electric field strength of 650 V/mm) is applied to the piezoelectric element at a temperature (e.g. about 10° C.) slightly lower than the Curie temperature $T_C$, to cause first domains to be generated. Subsequently, in a second polarization treatment, a weak DC voltage or a pulse-like voltage is applied to the piezoelectric element in an opposite direction to the direction of application of the voltage in the first polarization treatment while cooling the piezoelectric element at a fixed rate, to cause second domains to be generated.

Next, insulation properties of the piezoelectric material according to the present invention will be described. It is preferable that the dielectric loss tan δ of the piezoelectric material according to the present invention at a frequency of 1 kHz at 25° C. is not higher than 0.006. Further, it is preferable that the specific electric resistance at 25° C. is not lower than 1 GΩ cm. If the dielectric loss tan δ is lower than 0.006, even when an electric field having the maximum electric field strength of 500 V/cm is applied to the piezoelectric material under driving conditions of the piezoelectric element, it is possible to stably operate the piezoelectric element. Further, if the specific electric resistance is not lower than 1 GΩ cm, it is possible to obtain sufficient effects of polarization. It is possible to measure the dielectric loss tan δ and the specific electric resistance, using an impedance analyzer, by applying e.g. an AC electric field with a frequency of 1 kHz and an electric field strength of 10 V/cm to the piezoelectric element.

Figure 3A:
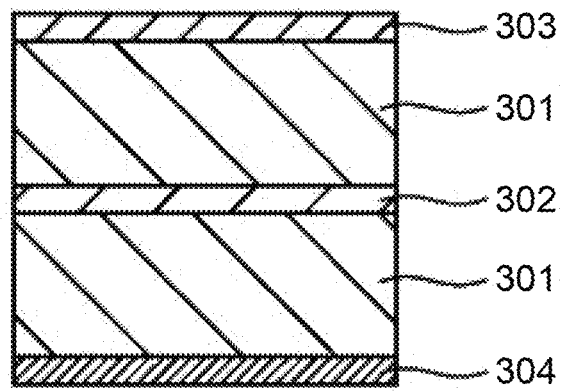
FIGS. 3A and 3B are respective partial cross-sectional views of other examples of the piezoelectric element.
Figure 3B:
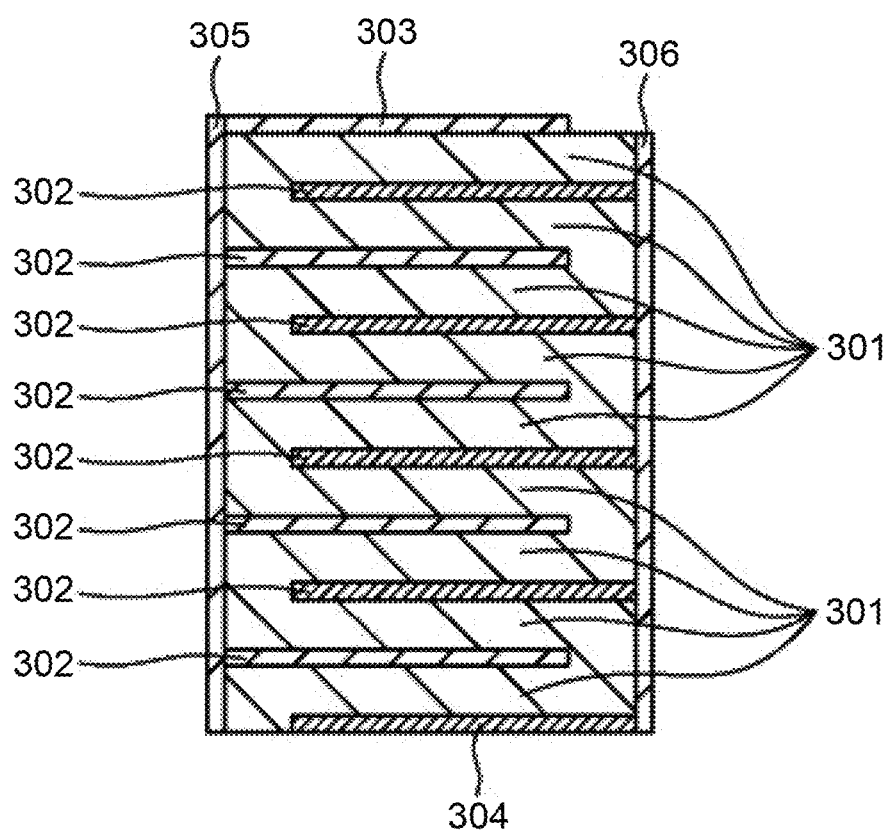

Next, insulation properties of the piezoelectric element according to the embodiment of the present invention will be described. FIGS. 3A and 3B are respective partial cross-sectional views of other examples of the piezoelectric element according to the embodiment of the present invention. Referring to FIGS. 3A and 3B, the piezoelectric element, denoted by reference numeral 300, includes piezoelectric material layers 301 and at least one layer of an internal electrode 302, and the piezoelectric material layers 301 and the at least one layer of the internal electrode 302 are alternately stacked. The piezoelectric material layers 301 are composed of the piezoelectric material described above. As layers of electrodes, there are provided not only the at least one layer of the internal electrode 302, but also respective layers of an upper electrode 303 and a lower electrode 304. For example, the piezoelectric element 300 may have a layered structure in which two piezoelectric material layers 301 and one layer of the internal electrode 302 are alternately stacked (FIG. 3A). The upper electrode 303 and the lower electrode 304 are disposed on the top and bottom of the layered structure, respectively. The number of piezoelectric material layers 301 and the number of layers of the internal electrode 302 are neither limited to the example shown in FIG. 3A, nor particularly limited. For example, the piezoelectric element 300 may have a layered structure in which nine piezoelectric material layers 301 and eight layers of the internal electrode 302 are alternately stacked (FIG. 3B). The upper electrode 303 and the lower electrode 304 are also disposed on the top and bottom of this layered structure, respectively. Further, to short-circuit layers of the internal electrode 302 to each other, an external electrode 305 and an external electrode 306 are disposed on opposite sides of the layered structure. The size and shape of each of the internal electrode 302, the upper electrode 303, the lower electrode 304, and the external electrodes 305 and 306 are not necessarily required to be the same as the size and shape of the piezoelectric material layer 301, and each electrode may be divided into a plurality of portions. The internal electrode 302, the upper electrode 303, the lower electrode 304, and the external electrodes 305 and 306 are formed by conductive layers each having a thickness of about 5 nm to 10 µm. The material of each electrode is not particularly limited, but any material that is usually used in piezoelectric elements may be used. Examples of the material of electrodes include metals such as Ti, Pt, Ta, Ir, Sr, In, Sn, Au, Al, Fe, Cr, Ni, Pd, Ag, and Cu and compounds thereof. In particular, each of the internal electrode 302 and the external electrodes 305 and 306 may be composed of one of these materials or a mixture or an alloy of two or more of these materials, or may have a multilayered structure prepared by stacking layers of two or more of these materials. The electrodes 302 to 306 may be composed of materials different from each other.

In the piezoelectric element 300, in particular, the internal electrode 302 preferably contains Ag and Pd, and a weight ratio M1/M2, which is a ratio of an Ag content by weight M1 to a Pd content by weight M2, preferably satisfies $0.25 \leq M1/M2 \leq 4.0$, more preferably satisfies $0.3 \leq M1/M2 \leq 3.0$. When the weight ratio M1/M2 is lower than 0.25, the sintering temperature of the internal electrodes becomes high, which is undesirable. On the other hand, when the weight ratio M1/M2 exceeds 4.0, the internal electrodes are formed into an island shape and become uneven in the plane, which is undesirable. To reduce the cost of the electrode material, the internal electrode 302 preferably contains at least one of Ni and Cu. When at least one of Ni and Cu is used for the internal electrode 302, the piezoelectric element 300 is preferably sintered in a reducing atmosphere. Further, as shown in FIG. 3B, the layers of the internal electrodes 302 may be short-circuited to each other so as to match the phase of the driving voltage. For example, one half of the layers of the internal electrode 302 and the upper electrode 303 may be short-circuited through the external electrode 305, and the other half of the layers of the internal electrode 302 and the lower electrode 304 may be short-circuited through the external electrode 306. The layers of the internal electrode 302 short-circuited to the upper electrode 303 and the layers of the internal electrode 302 short-circuited to the lower electrode 304 may be alternately arranged. The form of short-circuiting between the electrodes is not limited to the form shown in FIG. 3B. Electrodes or wires for short-circuiting may be provided on side surfaces of the layered structure. Alternatively, a through hole penetrating the piezoelectric material layers 301 may be provided and the inside thereof may be filled with a conductive material so as to short-circuit the electrodes.

Figure 4A:
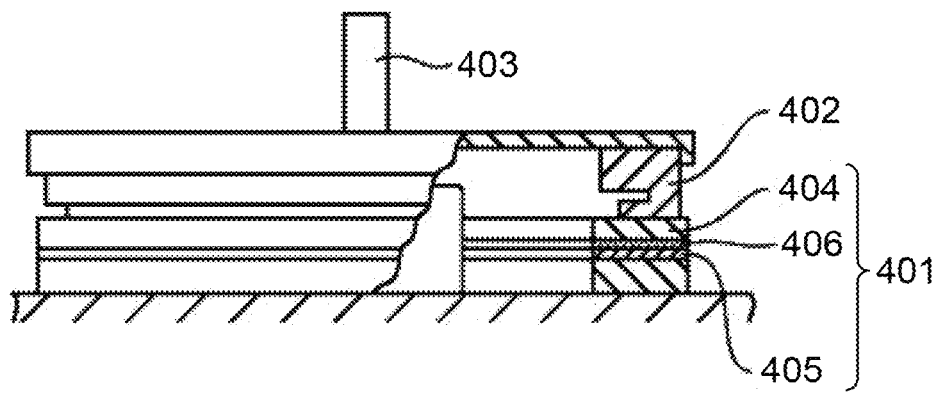
FIGS. 4A and 4B are respective schematic views of examples of a vibration wave motor according to an embodiment of the present invention.
Figure 4B:
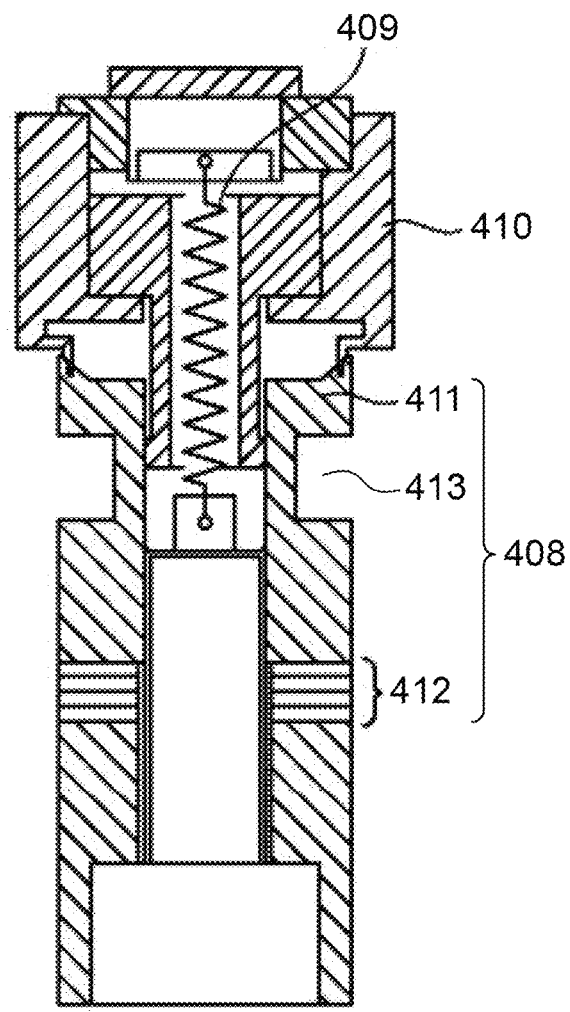

Next, a vibration wave motor according to an embodiment of the present invention will be described. FIGS. 4A and 4B are respective schematic views of examples of the vibration wave motor according to the embodiment of the present invention. The vibration wave motor, denoted by reference numeral 400, as one example of the vibration wave motor according to the embodiment of the present invention includes a vibrator 401 (vibration member), a rotor 402 (moving member) in pressure contact with a sliding surface of the vibrator 401 by a pressing force from a pressing spring (not shown), and an output shaft 403 that is integrally provided with the rotor 402 (FIG. 4A). The vibrator 401 has a metal elastic ring 404 and a piezoelectric element 405, and the piezoelectric element 405 is bonded to the metal elastic ring 404 with an organic adhesive 406 (such as an epoxy-based or cyanoacrylate-based adhesive). For example, similar to the piezoelectric element 200 described hereinabove, the piezoelectric element 405 has a single-layered structure (has only one piezoelectric material layer) and the piezoelectric material layer is sandwiched between an upper electrode and a lower electrode. Incidentally, when a voltage is applied to the piezoelectric material, the piezoelectric material is expanded and contracted by a piezoelectric transversal effect. In a case where an elastic member such as a metal member is joined to the piezoelectric element, the elastic member is bent as a result of expansion and contraction of the piezoelectric material, whereby a bending travelling wave is generated in the elastic member. The vibration wave motor 400 performs driving by utilizing the bending travelling wave. Specifically, when two phases of an alternating voltage that are different from each other by an odd number time of π/2 are applied to the piezoelectric element 405, the bending traveling wave is generated in the vibrator 401 and each point on the sliding surface of the vibrator 401 moves elliptically. The rotor 402 in pressure contact with the sliding surface of the vibrator 401 receives a frictional force from the vibrator 401 and rotates in a direction opposite to that of the bending travelling wave. In the vibration wave motor 400, an object to be driven (not shown) is joined to the output shaft 403 and is driven via the output shaft 403 by the rotational force of the rotor 402.

Further, a vibration wave motor 407 as the other example of the vibration wave motor according to the embodiment of the present invention includes a vibrator 408, and a rotor 410 in pressure contact with the vibrator 408 by a pressing spring 409 (FIG. 4B). The vibrator 408 includes a metal elastic member 411 divided into cylindrical portions, and a piezoelectric element 412 sandwiched between the divided cylindrical portions of the metal elastic member 411. For example, similar to the piezoelectric element 300 described hereinabove, the piezoelectric element 412 has a layered structure (has a plurality of piezoelectric material layers), and an upper electrode and a lower electrode are disposed outside the layered structure, while a plurality of layers of the internal electrode are disposed alternately with the piezoelectric material layers within the layered structure. The divided cylindrical portions of the metal elastic member 411 are fastened with bolts to sandwich and fix the piezoelectric element 412, thus forming the vibrator 408. By applying different two phases of an alternating voltage to the piezoelectric element 412, the vibrator 408 excites two vibrations orthogonal to each other. These two vibrations are combined to form a circular vibration that drives a tip of the vibrator 408. The vibration wave motor 407 has an annular recessed groove 413 formed in an upper portion of the vibrator 408 to increase the displacement of the circular vibration for driving. The rotor 410 is in pressure contact with the vibrator 408 and hence receives a frictional force for driving, from the vibrator 408. The rotor 410 is rotatably supported by a bearing, not shown.

Figure 5A:
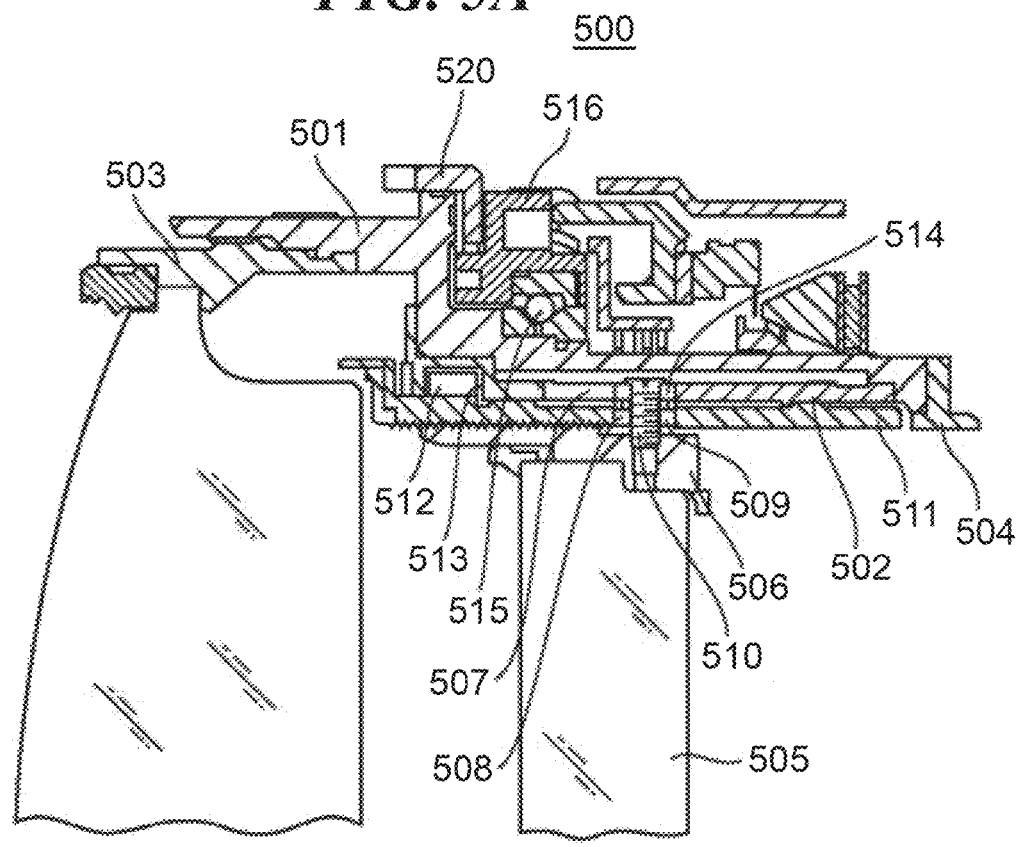
FIG. 5A is a cross-sectional view of essential parts of an exchangeable lens barrel of an example of a single lens reflex camera as an optical apparatus according to an embodiment of the present invention.
Figure 5B:
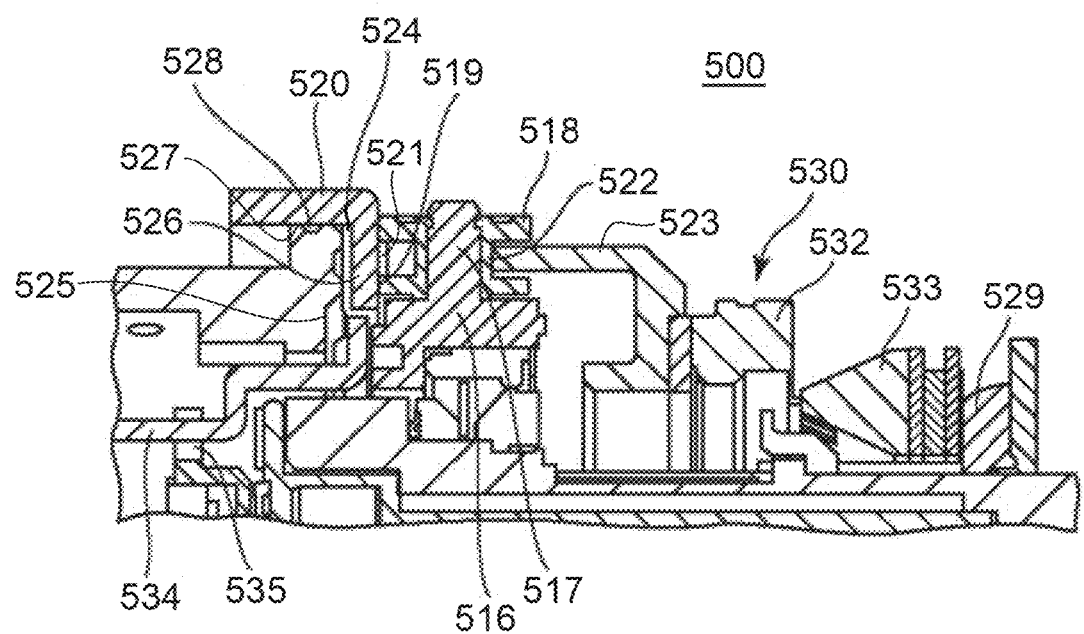
FIG. 5B is an expanded cross-sectional view of part of the essential parts of the exchangeable lens barrel shown in FIG. 5A.
Figure 6:
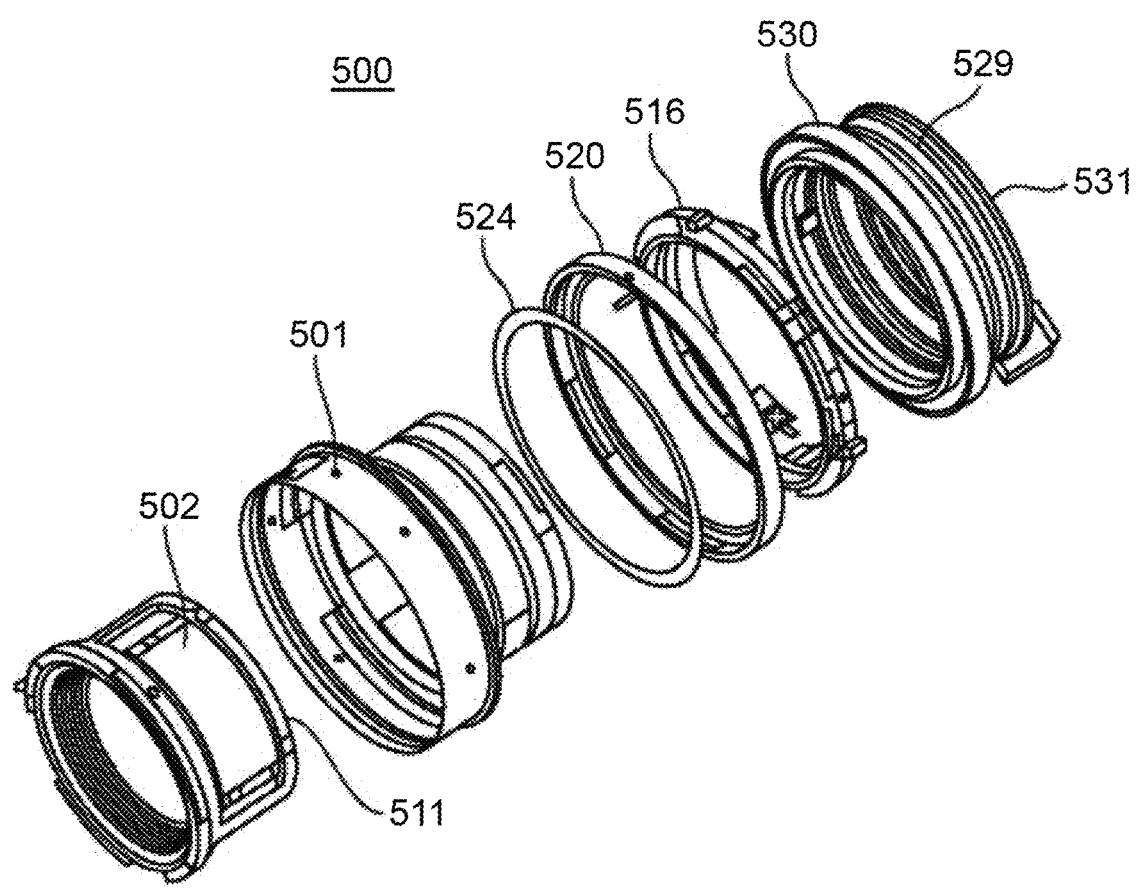
FIG. 6 is an exploded perspective view of the exchangeable lens barrel.

Next, an optical apparatus according to an embodiment of the present invention will be described. FIG. 5A is a cross-sectional view of essential parts of an exchangeable lens barrel of a single lens reflex camera as an example of the optical apparatus according to the embodiment of the present invention. FIG. 5B is an expanded cross-sectional view of part of the essential parts of the exchangeable lens barrel shown in FIG. 5A. FIG. 6 is an exploded perspective view of the exchangeable lens barrel. Referring to FIGS. 5A, 5B and FIG. 6, the exchangeable lens barrel, denoted by reference numeral 500, includes a fixed barrel 501, a linear guide barrel 502, and a front group lens barrel 503, as fixed members of the lens barrel, which are fixed to a mount 504 that is attachable to and detachable from the camera. Further, the exchangeable lens barrel 500 includes a focus lens 505 and a rear group lens barrel 506 holding the focus lens 505 (see FIG. 5A). The linear guide barrel 502 is formed with a linear guide groove 507 extending in an optical axis direction, for guiding the focus lens 505. Cam rollers 508 and 509 that protrude outward in a radial direction are fixed, with a screw 510, to the rear group lens barrel 506. The cam roller 508 is fitted in the linear guide groove 507. A cam ring 511 is rotatably fitted to the inner periphery of the linear guide barrel 502. A roller 512 fixed to the cam ring 511 is fitted in an annular groove 513 of the linear guide barrel 502, whereby the linear guide barrel 502 and the cam ring 511 are restricted from relative moving in an optical axis direction, but move in unison in the optical axis direction. A cam groove 514 for the focus lens 505 is formed in the cam ring 511. The cam roller 509 is fitted in the cam groove 514. A rotation transmission ring 516 is disposed on the outer peripheral side of the fixed barrel 501. The rotation transmission ring 516 is held by a ball race 515 such that the rotation transmission ring 516 can be rotated at a particular position with respect to the fixed barrel 501. The rotation transmission ring 516 has shafts 517 each radially extending and rotatably holding a roller 518. A large-diameter portion 519 of the roller 518 is in contact with a mount-side end face 521 of a manual focus ring 520 (see FIG. 5B). A small-diameter portion 522 of the roller 518 is in contact with a joint member 523. In the exchangeable lens barrel 500, six rollers 518 are arranged on the outer periphery of the rotation transmission ring 516 at equal space intervals, and are rotatably held by the shafts 517, respectively.

A low-friction sheet 524 is arranged on the inner circumferential portion of the manual focus ring 520. The low-friction sheet 524 is sandwiched between a mount-side end face 525 of the fixed barrel 501 and a front-side end face 526 of the manual focus ring 520. An outer circumferential end face of the low-friction sheet 524 has a ring shape and is fitted in an inner circumferential portion 527 of the manual focus ring 520. The inner circumferential portion 527 of the manual focus ring 520 is fitted in an outer circumferential portion 528 of the fixed barrel 501. The low-friction sheet 524 has a function of reducing the friction occurring when the manual focus ring 520 rotates about the optical axis relative to the fixed barrel 501. Note that the large-diameter portion 519 of the roller 518 is brought into contact with the mount-side end face 521 of the manual focus ring 520 under pressure by a force generated by a wave washer 529 that presses a vibration wave motor 530 toward the front side of the lens. The vibration wave motor 530 forms a driving section of the exchangeable lens barrel 500, and has a structure similar to that of the vibration wave motor 400, for example. Further, the small-diameter portion 522 of the roller 518 is brought into contact with the joint member 523 under an appropriate degree of pressure by a force generated by the wave washer 529 that presses the vibration wave motor 530 toward the front side of the lens. The movement of the wave washer 529 in the mount direction is restricted by a washer 531 that is bayonet-mounted on the fixed barrel 501. A spring force (urging force) generated by the wave washer 529 is transmitted to the vibration wave motor 530 and further to the roller 518, and also serves as a force for pressing the manual focus ring 520 against the mount-side end face 525 of the fixed barrel 501. That is, the manual focus ring 520 is assembled into the exchangeable lens barrel 500 in a state pressed on the mount-side end face 525 of the fixed barrel 501 with the low-friction sheet 524 therebetween. Accordingly, when the vibration wave motor 530 is driven for rotation with respect to the fixed barrel 501, the roller 518 rotates about the center of the shaft 517 because the joint member 523 is in frictional contact with the small-diameter portion 522 of the roller 518. This causes the rotation transmission ring 516 to rotate about the optical axis (automatic focusing operation). Now, let us consider a case where a rotational force about the optical axis is applied from a manual operation input unit (not shown) to the manual focus ring 520. In this case, the roller 518 rotates about the shaft 517 by a frictional force because the mount-side end face 521 of the manual focus ring 520 is in pressure contact with the large-diameter portion 519 of the roller 518. This also causes the rotation transmission ring 516 to rotate about the optical axis. At this time, the vibration wave motor 530 is prevented from rotating due to a frictional retention force of a rotor 532 and a stator 533 (manual focusing operation).

Two focus keys 534 are attached to the rotation transmission ring 516 such that they are opposed to each other across the rotation transmission ring 516. The focus keys 534 are fitted in notches 535 provided at an end of the cam ring 511. Accordingly, when the automatic focusing operation or the manual focusing operation is performed, causing the rotation transmission ring 516 to be rotated about the optical axis, the rotational force is transmitted to the cam ring 511 via the focus keys 534. When the cam ring 511 is rotated about the optical axis, the rear group lens barrel 506, whose rotation is restricted by the cam roller 508 and the linear guide groove 507, is moved back and forth along the cam groove 514 in the cam ring 511 by the cam roller 509. Thus, the focus lens 505 is driven to perform a focusing operation.

The replaceable lens barrel of the single-lens reflex camera has been described as an example of the optical apparatus to which the vibration wave motor according to the embodiment of the present invention is applied. However, the optical apparatus to which the vibration wave motor according to the embodiment of the present invention is applied is not limited to this. For example, the vibration wave motor according to the embodiment of the present invention is applicable to any optical apparatus that includes a driving unit, including any type of camera, such as a compact camera, an electronic still camera, or a mobile information terminal equipped with a camera.

Figure 7:
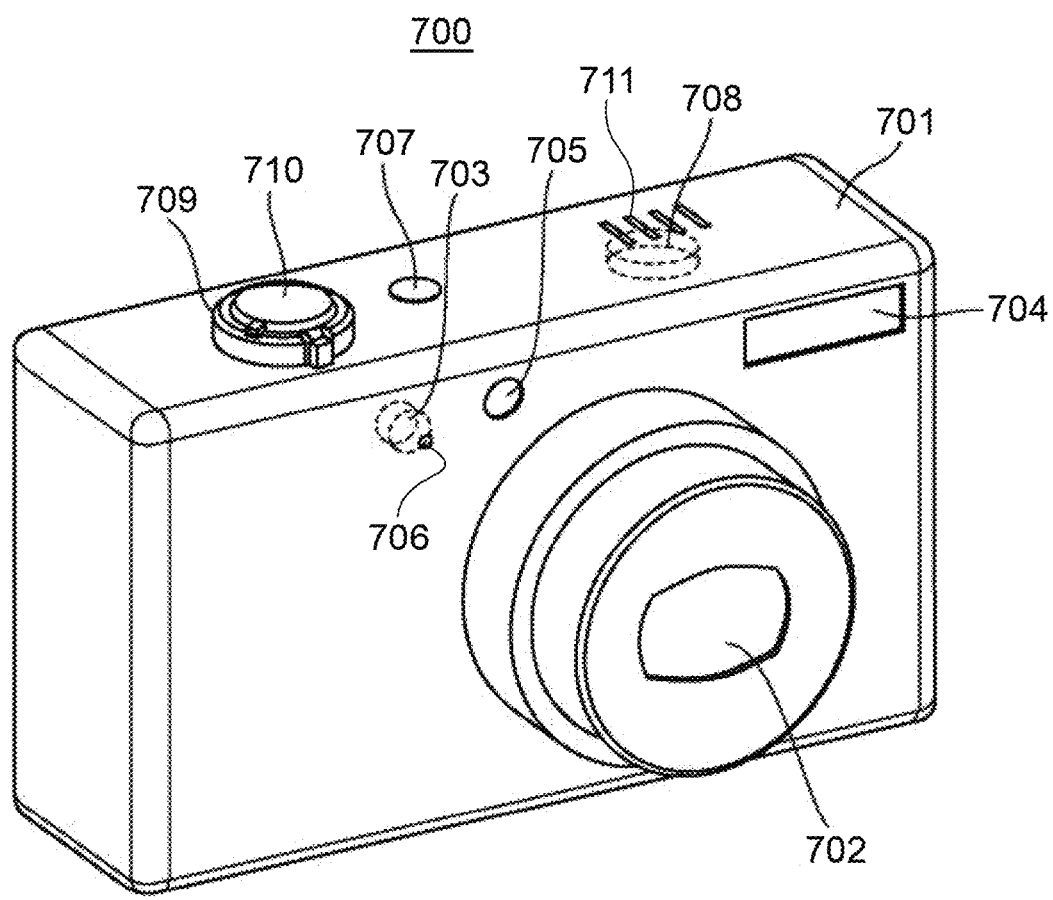
FIG. 7 is an overall perspective view of an example of a digital camera as an electronic apparatus according to an embodiment of the present invention.

Next, an electronic apparatus according to an embodiment of the present invention will be described. The electronic apparatus according to the embodiment of the present invention includes a piezoelectric element as a drive source. For example, an electronic apparatus incorporating a piezoelectric acoustic component, such as a loudspeaker, a buzzer, a microphone, or a surface-acoustic-wave (SAW) device, is the electronic apparatus according to the embodiment. Other examples of the electronic apparatus according to the embodiment include a liquid ejection apparatus, a vibration device, a dust removing device, a movable mirror device, an ultrasonic oscillation device, a sensor device, a shutter device, and so forth, each including a drive source. FIG. 7 is an overall perspective view of a digital camera, which is an example of the electronic apparatus according to the embodiment of the present invention, as viewed from the front. The digital camera, denoted by reference numeral 700 includes a main body 701, and an optical device 702 including a lens barrel, a microphone 703 (see broken lines), a strobe light-emitting unit 704, and an auxiliary light unit 705 are disposed in the front surface of the main body 701. A hole 706 for collecting sound from the outside is provided at the front of the microphone 703. A power button 707, a speaker 708, a zoom lever 709, and a release button 710 for performing a photographing operation are disposed in the upper surface of the main body 701. Since the speaker 708 is provided inside the main body 701, the speaker 708 is shown by a broken line. Speaker holes 711 for outputting sound to the outside are provided at the front of the speaker 708. In the digital camera 700, the piezoelectric element 200 or the piezoelectric element 300, described above, is incorporated in the piezoelectric acoustic component, such as the microphone 703 and the speaker 708.

The digital camera has been described as an example of the electronic apparatus according to the embodiment of the present invention. However, the electronic apparatus according to the embodiment of the present invention is not limited to this, but includes electronic apparatuses, such as a sound-reproducing apparatus, a sound-recording apparatus, a mobile phone, and an information terminal, each including one of various kinds of piezoelectric acoustic components incorporating the piezoelectric element 200 or the piezoelectric element 300.

As described above, the piezoelectric element 200 or the piezoelectric element 300 is suitably used in the vibration wave motor, the optical apparatus, and the electronic apparatus. For example, by incorporating the piezoelectric element 200 or the piezoelectric element 300, it is possible to provide a vibration wave motor that exhibits a driving force and durability comparable or superior to a conventional one incorporating a piezoelectric element containing lead. Further, by incorporating the vibration wave motor, it is possible to provide an optical apparatus that exhibits durability and operating accuracy comparable or superior to a conventional one incorporating a piezoelectric element containing lead. Further, by using a piezoelectric acoustic component incorporating the piezoelectric element 200 or the piezoelectric element 300, it is possible to provide an electronic apparatus that exhibits sound generating properties comparable or superior to a conventional one incorporating a piezoelectric element containing lead. Note that the piezoelectric material according to the present invention can be used not only in vibration wave motors and electronic apparatuses but also in devices such as ultrasonic vibrators, piezoelectric actuators, piezoelectric sensors, and ferroelectric memories.

Figure 8A:
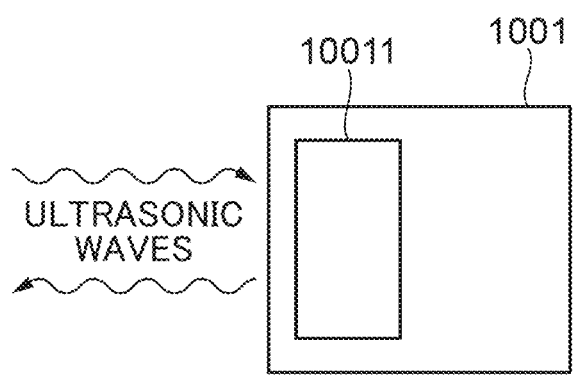
FIG. 8A is a schematic view useful in explaining an ultrasonic probe according to an embodiment of the present invention.

Next, an ultrasonic probe according to an embodiment of the present invention will be described. The ultrasonic probe according to the embodiment of the present invention includes the piezoelectric actuator described hereinabove, and has a function of oscillating ultrasonic waves and a function of receiving reflected ultrasonic waves. FIG. 8A is a schematic diagram of an example of the ultrasonic probe according to the embodiment of the present invention. However, the numbers, shapes, and arrangements of component members are not limited to those shown in FIG. 8A. The illustrated ultrasonic probe, denoted by reference numeral 1001, incorporates a piezoelectric actuator 10011, and oscillates (transmits) ultrasonic waves generated by an inverse piezoelectric effect of the piezoelectric actuator 10011 toward a test object. Arrow-headed wavy lines in FIG. 8A are schematic representations of propagation of ultrasonic waves, but do not represent members of the ultrasonic probe 1001. The ultrasonic waves are reflected from internal texture of the test object, and return as an ultrasonic echo toward the ultrasonic probe 1001. Vibrations caused by the ultrasonic echo are converted to electric signals by the piezoelectric actuator 10011, whereby information on the internal structure of the test object is obtained. The piezoelectric actuator 10011, as a single unit, may not be responsible for both of oscillation and reception of ultrasonic waves, but a substitute unit other than the piezoelectric actuator may be responsible one of the two functions.

Figure 8B:
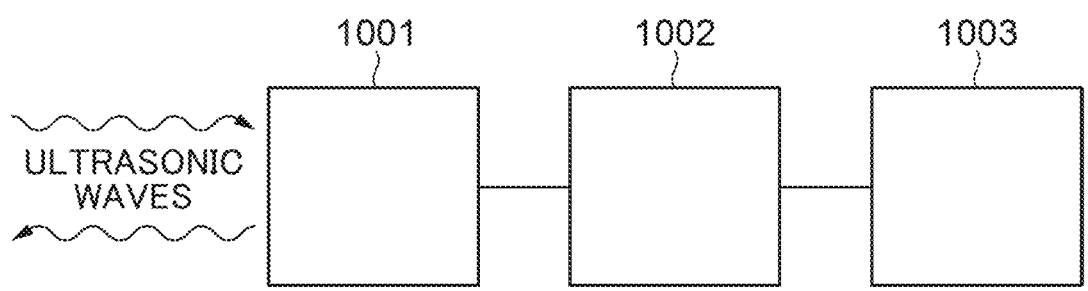
FIG. 8B is a schematic view useful in explaining an ultrasonographic apparatus according to an embodiment of the present invention.

Next, an ultrasonic inspection apparatus according to an embodiment of the present invention will be described. The ultrasonic inspection apparatus according to the embodiment of the present invention includes the ultrasonic probe described above, a signal processing unit, and an image generation unit. FIG. 8B is a schematic diagram of an example of the ultrasonic inspection apparatus according to the embodiment of the present invention. However, an order of connection of the components is not limited to that shown in FIG. 8B. In the ultrasonic inspection apparatus according to the embodiment of the present invention shown in FIG. 8B, electric signals generated by the reflected ultrasonic waves received by the ultrasonic probe 1001 are converted to data for storage by the signal processing unit, denoted by reference numeral 1002, and the stored data is converted to image information by the image generation unit, denoted by reference numeral 1003. The ultrasonic inspection apparatus also has a function of transmitting the image information to an external image display unit (display).

EXAMPLES

The present invention will now be described more specifically by using Examples. However, the present invention is not limited to the Examples described below. In the first place, Examples 1 to 5 and Comparative Examples 1 and 2 will be described. First, raw material powders of barium titanate, calcium titanate, calcium zirconate, each of which is a perovskite-type metal oxide, were prepared by the solid phase method. All of the raw material powders had an average grain size of 300 nm, and a purity of not lower than 99.99%. After that, these raw material powders were mixed with a manganese dioxide ($MnO_2$) powder having a purity of not lower than 99.5%. In doing this, Ba, Ca, Ti, Zr, and Mn were mixed after weighing such that the amounts of these satisfied a composition of the above Formula (1) in which x=0.14, y=0.050, z=0.002, and a=0.9955. Further, to adjust the ratio a in the above Formula (1), proper amounts of barium carbonate and titanium oxide were added. The resulting powder mixture was dry-mixed in a ball mill for 24 hours to prepare a mixed powder.

Next, the total weight of the mixed powder was defined as 100 parts by weight, and 3 parts by weight of a PVA binder relative to the mixed powder was caused to adhere to surfaces of the mixed powder by using a spray dryer, whereby a granulated powder is prepared. Subsequently, the granulated powder was charged in a mold and pressed under a molding pressure of 200 MPa by using a press-molding machine to prepare a disk-shaped green compact. The surface of the mold had been coated with a non-magnesium-based mold release agent in advance. The green compact may be further pressed by using a cold isostatic press-molding machine. Also in such a case, the same results were obtained.

The prepared green compact was placed in an electric furnace, and first sintered in an air atmosphere by holding the temperature at 600° C., whereafter the temperature was raised to 1330° C., and held at 1330° C. over a time period shown in Table 1 in FIG. 9. Subsequently, the green compact was cooled to room temperature by natural cooling. Thus, disk-shaped ceramics (Examples 1 to 5, and Comparative Example 1 and 2) were prepared.

Next, a measured density of the piezoelectric material (at 25° C.) was evaluated by the Archimedes method. Further, a relative density of the piezoelectric material was evaluated by using a theoretical density calculated from lattice constants determined by X-ray diffractometry, described below, and the weighed composition, and the measured density evaluated by the Archimedes method. The relative density thus obtained on each of Examples 1 to 5 and Comparative Examples 1 and 2 is shown in Table 2 in FIG. 10. The relative density of the piezoelectric material of Comparative Example 1 was as low as 90.8%, which indicates insufficient sintering. Next, each disk-shaped ceramic was polished to a thickness of 0.5 mm, and a crystal structure of the disk-shaped ceramic was analyzed by X-ray diffractometry on the polished surface thereof at an ambient temperature of 25° C. As a result, peaks attributable to a tetragonal perovskite structure were observed in all of the ceramics of Examples 1 to 5 and Comparative Examples 1 and 2.

Next, the composition of the disk-shaped ceramic of each of Examples 1 to 5 and Comparative Examples 1 and 2 was evaluated by X-ray fluorescence analysis. The results showed that the compositions evaluated from disk-shaped ceramics match the weighed composition of $(Ba_{0.86}Ca_{0.14})_{0.9955}(Ti_{0.948}Zr_{0.050}Mn_{0.002})O_3$. Further, the content of a Pb component in all of the disk-shaped ceramics (Examples 1 to 5 and Comparative Examples 1 and 2) was less than 1000 ppm.

Thereafter, each disk-shaped ceramic was polished to a thickness of about 0.5 mm, and gold electrodes having a thickness of 400 nm was formed on respective opposite sides of the above-described disk-shaped ceramic by a DC sputtering method. Note that a titanium film having a thickness of 30 nm and functioning as an adhesive layer was formed between each electrode and the ceramic. The ceramic with the electrodes was cut to prepare a strip-shaped piezoelectric element having dimensions of 10 mm×2.5 mm×0.5 mm. Further, as the first polarization treatment, each strip-shaped piezoelectric element was heated such that temperature of a surface thereof became 100° C., and a DC voltage was applied to the gold electrodes such that an electric field having an electric field strength of 1 kV/mm was generated in the ceramic, for 30 minutes. Then, the ceramic was cooled to room temperature by natural cooling. Thereafter, as the second polarization treatment, each strip-shaped piezoelectric element was heated such that the temperature of a surface thereof became 75° C., and a DC voltage was applied to the gold electrodes such that an electric field having an electric field strength of 500 V/mm was generated in the ceramic in a direction opposite to the direction of the first polarization treatment, for 10 minutes. Then, the ceramic was cooled by natural cooling. Thus, piezoelectric elements according to the present invention (Examples 1 to 5) and piezoelectric elements (Comparative Examples 1 and 2) were made. Subsequently, as static characteristics of the piezoelectric elements of Examples 1 to 5 and the piezoelectric elements of Comparative Examples 1 and 2, the piezoelectric constant $d_{31}$ and the mechanical quality factor $Q_m$ of these strip-shaped piezoelectric elements under room temperature were measured, by the resonance-antiresonance method. In this measurement, an impedance analyzer (model 4294A, Agilent Technologies) was used. Results of the measurement are shown in Table 2 in FIG. 10. Note that in each of Tables, referred to hereinafter, the absolute value of piezoelectric constant $d_{31}$ under room temperature is denoted as "$|d_{31,RT}|$", and the mechanical quality factor $Q_m$ under room temperature is denoted as "$Q_{m,RT}$".

Next, cross-section samples for observing crystal grains and domains are prepared from piezoelectric elements according to the present invention and the piezoelectric elements of Comparative Examples 1 and 2. First, each piezoelectric element is mechanically polished using an abrasive paper having abrasive grains embedded therein, a diamond slurry, or the like, and is then subjected to chemical etching to prepare cross-section samples with a mirror-finished surface. Subsequently, each cross-section sample is fixed on a sample table for SEM with conductive paste, and a carbon film with a thickness of 3 nm is vapor-deposited on the cross-sectional surface thereof.

Then, the cross-sectional surface of each prepared cross-section sample is observed by SEM, and from photograph images obtained by SEM, an average equivalent circle diameter of crystal grains is calculated. Specifically, three photograph images at a magnification of about 4000 times were obtained from each cross-section sample, and about 600 crystal grains were observed in each of the photograph images. The observed photograph images were subjected to image processing to calculate an average equivalent circle diameter. Results of the thus performed calculation and measurement are shown in Table 2 in FIG. 10. Note that the calculation of an average equivalent circle diameter may be performed based on the photograph image of a cross-sections of any of a disk-shaped ceramic, a piezoelectric element before polarization, and a piezoelectric element after polarization.

Further, the cross-section of each prepared cross-section sample is observed by SEM, and from photograph images obtained by SEM, respective widths of domains were measured. Detection of domains is performed by a reflection electron detector. Specifically, five photograph images at a magnification of about 4000 times were obtained from each cross-section sample, and about 1000 crystal grains were observed in each of the photograph images to check whether or not first domains and second domains were present. Results of the thus performed measurement are shown in Table 2 in FIG. 10. The widths of the first domains are relatively large, i.e. not smaller than 300 nm and not larger than 800 nm, whereas the widths of the second domains are relatively small, i.e. not smaller than 20 nm and not larger than 50 nm.

Further, the piezoelectric constant $d_{31}$ and the mechanical quality factor $Q_m$, under room temperature, of the piezoelectric elements according to the present invention and the piezoelectric elements of Comparative Examples 1 and 2 were measured. Results of the thus performed measurement are also shown in Table 2 in FIG. 10

As shown in Table 2, Comparative Example 1 included both of crystal grains A each having the first domain and crystal grains B each having the second domain. However, the average equivalent circle diameter of crystal grains was smaller than 1.0 µm, and due to a low relative density, which indicates insufficiency of sintering, the mechanical quality factor $Q_m$ under room temperature ($Q_{m, RT}$ in Table 2) was as low as 470. Therefore, Comparative Example 1 is large in elasticity loss caused by vibration, and hence is unsuitable for use as a drive source. As shown in Table 2, Comparative Example 2 included both of crystal grains A each having the first domain and crystal grains B each having the second domain. However, the average equivalent circle diameter of crystal grains was larger than 10 µm, the absolute value of the piezoelectric constant $d_{31}$ under room temperature ($|d_{31, RT}|$ in Table 2) was lower than 50 pm/V, and the mechanical quality factor $Q_m$ under room temperature ($Q_{m, RT}$ in Table 2) was as low as 510. Therefore, Comparative Example 2 is difficult to be expanded and contracted when vibrating, and is large in elasticity loss caused by vibration, and hence is unsuitable for use as a drive source. On the other hand, as shown in Table 2, Examples 1 to 5 have average equivalent circle diameters of crystal grains of not smaller than 1.0 µm and not larger than 10 µm. Further, Examples 1 to 5 included both of crystal grains A each having the first domain and crystal grains B each having the second domain, the absolute value of the piezoelectric constant $d_{31}$ under room temperature was not lower than 70 pm/V, and the mechanical quality factor $Q_m$ was also not lower than 600. Therefore, the piezoelectric elements of Examples 1 to 5 were each found to be easy to be expanded and contracted when vibrating, and small in elasticity loss caused by vibration, which means that they are suitable for use as a drive source.

Next, Examples 6 to 10 will be described. Similar to Examples 1 to 5, after weighing raw material powders, the raw material powders were mixed to prepare a mixed powder. After that, disk-shaped ceramics (common to Examples 6 to 10) were prepared by the same procedure as used for Examples 1 to 5, except that the temperature of the prepared green compact was raised using an electric furnace to 1340° C. and held at 1340° C. over a common time period of 5.5 hours.

Next, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Further, the composition of each of all the disk-shaped ceramics was evaluated by X-ray fluorescence analysis. As a result, it was found that the evaluated composition matched the weighed composition of $(Ba_{0.86}Ca_{0.14})_{0.9955}(Ti_{0.948}Zr_{0.050}Mn_{0.002})O_3$. Further, the content of a Pb component in all of the disk-shaped ceramics (Examples 6 to 10) was less than 1000 ppm. Thereafter, similar to Examples 1 to 5, piezoelectric elements according to the present invention (Examples 6 to 10) were each made by preparing a strip-shaped piezoelectric element from each disk-shaped ceramic, and subjecting the strip-shaped piezoelectric element to the first polarization treatment and then to the second polarization treatment. Note that in the second polarization treatment at this time, the time period over which the DC voltage was to be applied was set to a time period S shown in Table 3 in FIG. 11.

Next, similar to Examples 1 to 5, from the piezoelectric elements according to the present invention (Examples 6 to 10), cross-section samples for observing crystal grains and domains were prepared by the same procedure as used for Examples 1 to 5. Further, under the same conditions as those of Examples 1 to 5, an average equivalent circle diameter of crystal grains in each cross-section sample was calculated. Results of the calculation are shown in Table 3 in FIG. 11. Note that, similar to Examples 1 to 5, the calculation of an average equivalent circle diameter may be performed based on the photograph image of a cross-sections of any of a disk-shaped ceramic, a piezoelectric element before polarization, and a piezoelectric element after polarization.

Further, cross-sections of the cross-section samples of the piezoelectric elements according to the present invention (Examples 6 to 10) were observed by SEM, and respective widths of domains were measured from photograph images obtained by SEM. At this time as well, detection of domains is performed by the reflection electron detector. Specifically, ten photograph images at a magnification of about 4000 times were obtained from each cross-section sample, and about 2000 crystal grains were observed in each of the photograph images to observe domains in the crystal grains. Results of the thus performed measurement are shown in Table 3 in FIG. 11. Further, the obtained photograph images were subjected to image processing, whereby a number density (% by number) of crystal grains A each having the first domain and a number density (% by number) of crystal grains B each having the second domain were calculated. Results of the calculation are shown in Table 3 in FIG. 11. Further, the piezoelectric constant $d_{31}$ and the mechanical quality factor $Q_m$, under room temperature, of the piezoelectric elements according to the present invention (Examples 6 to 10) were measured. Results of the thus performed measurement are also shown in Table 3 in FIG. 11.

As shown in Table 3, in all of Examples 6 to 10, the average equivalent circle diameters of crystal grains was not smaller than 1.0 µm and not larger than 10 µm, and there were included both of crystal grains A each having the first domain and crystal grains B each having the second domain. Further, the absolute value of the piezoelectric constant $d_{31}$ under room temperature was not lower than 50 pm/V, and the mechanical quality factor $Q_m$ was also not lower than 600. In particular, in Examples 7 to 9 in which not less than 5% by number of crystal grains each having the first domain and the second domain were present, the absolute value of the piezoelectric constant $d_{31}$ under room temperature was not lower than 80 pm/V, and the mechanical quality factor $Q_m$ was also not lower than 800. Therefore, the piezoelectric elements of Examples 7 to 9 were each found to be easy to be expanded and contracted when vibrating, and small in elasticity loss caused by vibration, which are particularly suitable piezoelectric characteristics.

Next, Examples 11 and 12 will be described. First, the same raw material powders as used in Examples 1 to 5 were mixed after weighing such that the amounts of Ba, Ca, Ti, Zr, and Mn satisfied the composition of the above Formula (1) in which x=0.14, y=0.050, z=0.002, and a=0.9955. Further, to adjust the ratio a in the above Formula (1), proper amounts of barium carbonate and titanium oxide were added. The mixture of these raw material powders was dry-mixed in the ball mill for 24 hours to prepare a mixed powder. Thereafter, disk-shaped ceramics (common to Examples 11 and 12) were prepared by the same procedure as used for Examples 6 to 10.

Next, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Further, the composition of each of all the disk-shaped ceramics was evaluated by X-ray fluorescence analysis. As a result, it was found that the evaluated composition matched the weighed composition of $(Ba_{0.86}Ca_{0.14})_{0.9955}(Ti_{0.948}Zr_{0.050}Mn_{0.002})O_3$. Further, the content of a Pb component in each of the disk-shaped ceramics (Examples 11 and 12) was less than 1000 ppm.

Thereafter, similar to Examples 1 to 5, piezoelectric elements according to the present invention (Examples 11 and 12) were each made by preparing a strip-shaped piezoelectric element from each disk-shaped ceramic, and subjecting the strip-shaped piezoelectric element to the first polarization treatment and then to the second polarization treatment. However, in the second polarization treatment for the piezoelectric element of Example 11, the time period over which the DC voltage was to be applied was set to 13 minutes, and in the second polarization treatment for the piezoelectric element of Example 12, the time period over which the DC voltage was to be applied was set to 5 minutes. Subsequently, similar to Examples 1 to 5, the piezoelectric constant $d_{31}$ and the mechanical quality factor $Q_m$ of the piezoelectric elements according to the present invention were measured under room temperature. Results of the measurement are shown in Table 4 in FIG. 12.

Figure 13:
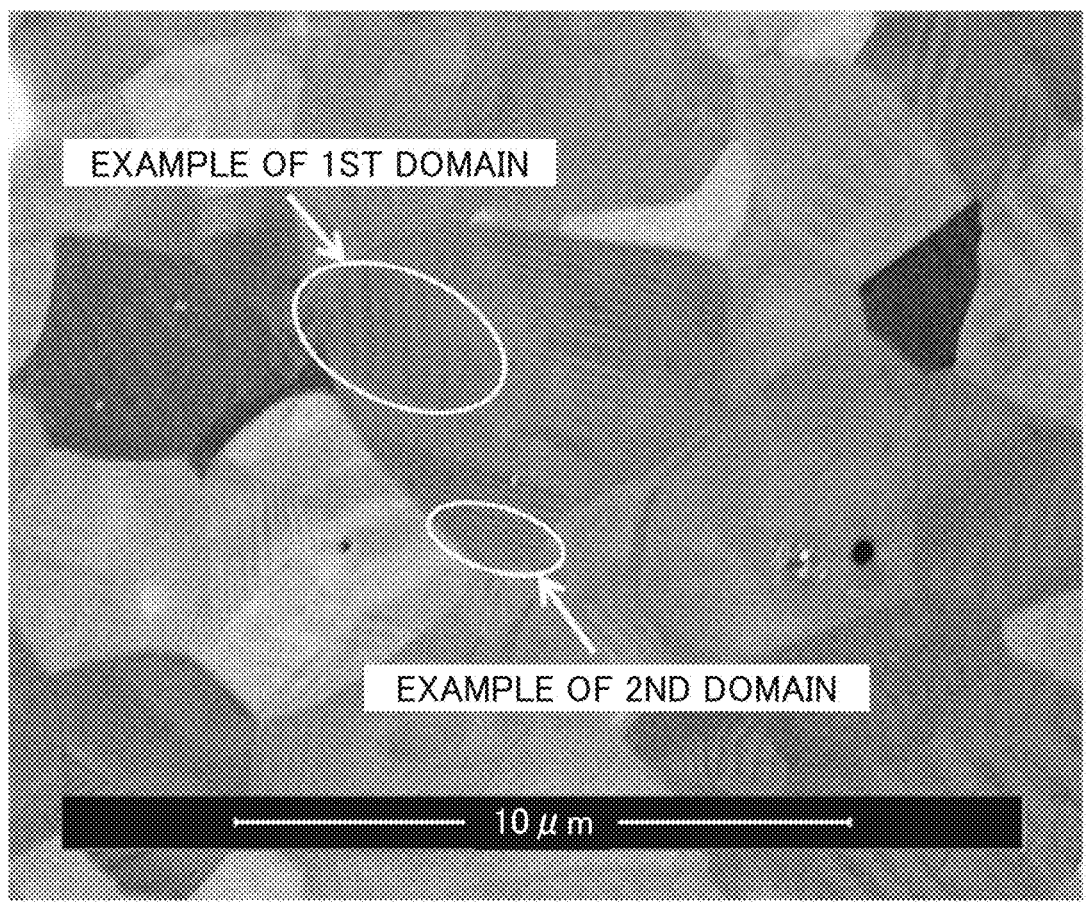
FIG. 13 is an expanded cross-sectional view of crystal grains including a crystal grain having both of a first domain and a second domain.

Next, similar to Examples 1 to 5, from the piezoelectric elements according to the present invention (Examples 11 and 12), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 11 and 12) were subjected to calculation of a number density (% by number) of crystal grains A each having the first domain and a number density (% by number) of crystal grains B each having the second domain. Results of the calculation and the measurement are shown in Table 4 in FIG. 12. The average equivalent circle diameters of crystal grains calculated as to the piezoelectric elements according to the present invention (Examples 11 and 12) were both equal to 2.8 μm. At this time, as shown in FIG. 13, some crystal grains each having both of the first domain and the second domain were found in Example 12, whereas in Example 11, no crystal grains each having both of the first domain and the second domain were found, but the first domain and the second domain were found to be present in respective different crystal grains. As is clear from Table 4, the piezoelectric material having crystal grains each having both of the first domain and the second domain is higher in the piezoelectric constant $d_{31}$ and the mechanical quality factor $Q_m$.

In both of Examples 11 and 12, the average equivalent circle diameter of crystal grains was not smaller than 1.0 μm and not larger than 10 μm. Further, as shown in Table 4, in both of Examples 11 and 12, crystal grains A each having the first domain and crystal grains B each having the second domain were both present in an amount of not less than 5% by number, the absolute value of the piezoelectric constant $d_{31}$ under room temperature was not lower than 80 pm/V, and the mechanical quality factor $Q_m$ was not lower than 800. Therefore, the piezoelectric elements of Examples 11 and 12 were each found to be easy to be expanded and contracted when vibrating, and small in elasticity loss caused by vibration, which are particularly suitable piezoelectric characteristics.

Next, Examples 13 and 14 will be described. First, the same raw material powders as used in Examples 1 to 5 were mixed after weighing such that the amounts of Ba, Ca, Ti, Zr, and Mn satisfied the composition of the above Formula (1) in which x=0.14, y=0.050, z=0.002, and a=0.9955. Further, to adjust the ratio a in the above Formula (1), proper amounts of barium carbonate and titanium oxide were added. The mixture of these raw material powders was dry-mixed in the ball mill for 24 hours to prepare a mixed powder. Thereafter, disk-shaped ceramics (common to Examples 13 and 14) were prepared by the same procedure as used for Examples 6 to 10.

Next, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Further, the composition of each of all the disk-shaped ceramics was evaluated by X-ray fluorescence analysis. As a result, it was found that the evaluated composition matched the weighed composition of $(Ba_{0.86}Ca_{0.14})_{0.9955}(Ti_{0.948}Zr_{0.050}Mn_{0.002})O_3$. Further, the content of a Pb component in each of the disk-shaped ceramics (Examples 13 and 14) was less than 1000 ppm.

Thereafter, similar to Examples 1 to 5, piezoelectric elements according to the present invention (Examples 13 and 14) were each made by preparing a strip-shaped piezoelectric element from each disk-shaped ceramic, and subjecting the strip-shaped piezoelectric element to the first polarization treatment and then to the second polarization treatment. However, in Example 13, the time period over which the DC voltage was to be applied in the first polarization treatment was set to 35 minutes, and the time period over which the DC voltage was to be applied in the second polarization treatment was set to 6 minutes. In Example 14, the time period over which the DC voltage was to be applied in the first polarization treatment was set to 60 minutes, and the time period over which the DC voltage was to be applied in the second polarization treatment was set to 7 minutes. Subsequently, similar to Examples 1 to 5, the piezoelectric constant $d_{31}$ and the mechanical quality factor $Q_m$ of the piezoelectric elements according to the present invention were measured under room temperature. Results of the measurement are shown in Table 5 in FIG. 14.

Figure 15:
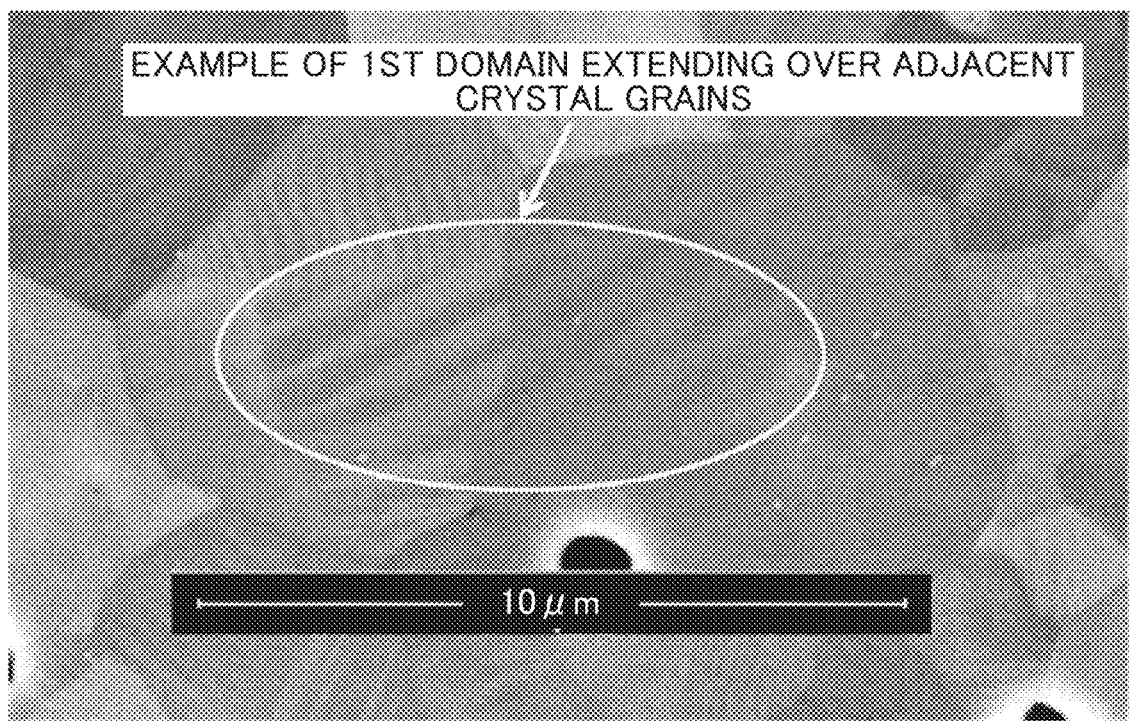
FIG. 15 is an expanded cross-sectional view of a first domain extending across a grain boundary of adjacent crystal grains.

Next, similar to Examples 1 to 5, from the piezoelectric elements according to the present invention (Examples 13 and 14), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 13 and 14) were subjected to calculation of a number density (% by number) of crystal grains A each having the first domain and a number density (% by number) of crystal grains B each having the second domain. Results of the calculation and the measurement are shown in Table 5 in FIG. 14. The average equivalent circle diameters of crystal grains calculated as to the piezoelectric elements according to the present invention (Examples 13 and 14) were both equal to 2.8 μm. At this time, in Example 14, as shown in FIG. 15, some first domains were found to each extend across a grain boundary between adjacent crystal grains. On the other hand, in Example 13, the first domains remained in respective singe crystal grains, and no first domains were found to extend across a grain boundary between adjacent crystal grains.

In both of Examples 13 and 14, the average equivalent circle diameter of crystal grains was not smaller than 1.0 μm and not larger than 10 μm. Further, as shown in Table 5, in both of Examples 13 and 14, crystal grains A each having the first domain and crystal grains B each having the second domain were both present in an amount of not less than 5% by number, the absolute value of the piezoelectric constant $d_{31}$ under room temperature was not lower than 90 pm/V, and the mechanical quality factor $Q_m$ under room temperature was not lower than 900. In particular, in Example 14 containing first domains each extending across a grain boundary between adjacent crystal grains, the mechanical quality factor $Q_m$ under room temperature was not lower than 1100. Therefore, the piezoelectric elements of Examples 13 and 14 were each found to be easy to be expanded and contracted when vibrating, and small in elasticity loss caused by vibration, which are particularly suitable piezoelectric characteristics.

Next, Examples 15 and 20 will be described. First, the same raw material powders as used in Examples 1 to 5 were mixed after weighing such that the amounts of Ba, Ca, Ti, Zr, and Mn satisfied the composition of the above Formula (1) in which y=0.050, z=0.002, and a=0.9955. At this time, the amounts of Ba, Ca, Ti, Zr, and Mn were adjusted such that the ratio x in the above Formula (1) became equal to one of values shown in Table 6 in FIG. 16. Further, to adjust the ratio a in the above Formula (1), proper amounts of barium carbonate and titanium oxide were added. The mixture of these raw material powders was dry-mixed in the ball mill for 24 hours to prepare a mixed powder to prepare a mixed powder, and a disk-shaped green compact was prepared by the same procedure as used for Examples 1 to 5. Then, the prepared green compact was placed in the electric furnace, and first sintered in an air atmosphere by holding the temperature at 600° C., whereafter the temperature was raised to a selected one of sintering temperatures shown in Table 6 in FIG. 16, and held at the sintering temperature over 5.5 hours. Subsequently, the green compact was cooled to room temperature by natural cooling. Thus, disk-shaped ceramics (Examples 15 to 20) were each prepared as the piezoelectric material.

Next, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Incidentally, when green compacts having the same composition as that of Examples 19 and 20 were sintered at 1340° C., $CaTiO_3$ was generated as an impurity phase. In view of this, in Example 19, the sintering temperature was set to 1370° C., and in Example 20, the sintering temperature was set to 1400° C. Thereafter, similar to Examples 1 to 5, the composition of each of all the disk-shaped ceramics was evaluated by X-ray fluorescence analysis. As a result, it was found as to each disk-shaped ceramic that the evaluated composition matched the weighed composition. Further, the content of a Pb component in each of the disk-shaped ceramics (Examples 15 to 20) was less than 1000 ppm.

Thereafter, similar to Examples 1 to 5, piezoelectric elements according to the present invention (Examples 15 to 20) were each made by preparing a strip-shaped piezoelectric element from each disk-shaped ceramic, and subjecting the strip-shaped piezoelectric element to the first polarization treatment and then to the second polarization treatment. However, in the first polarization treatment, the time period over which the DC voltage was to be applied was set to 70 minutes, and in the second polarization treatment, a DC voltage was applied to the gold electrodes such that an electric field having an electric field strength of 600 V/mm was generated in the ceramic in a direction opposite to the direction of the first polarization treatment.

Next, the piezoelectric elements according to the present invention (Examples 15 to 20) were each placed in a thermostat bath (SH-261 manufactured by ESPEC Corp.), and while changing ambient temperature in the thermostat bath, the piezoelectric constant $d_{31}$ and the mechanical quality factor $Q_m$ of the piezoelectric element were measured by the resonance and anti-resonance method. The temperature of the thermostat bath was changed at a rate of 5° C./minute, and after the change, the temperature was held for 5 minutes. Specifically, the temperature of each piezoelectric element was raised from 30° C. to 60° C., and then lowered to −30° C. Then, the measurement of the piezoelectric constant $d_{31}$ and the mechanical quality factor $Q_m$ was performed. Further, using the absolute values of the piezoelectric constant $d_{31}$ at 10° C. and 40° C. (denoted as "$|d_{31,10° C.}|$" and "$|d_{31,40° C.}|$", respectively), a dielectric constant change ratio "$|d_{31,40° C.}| d_{31,10° C.}|/|d_{31,RT}|$" was calculated. The part $|d_{31,40° C.} - d_{31,10° C.}|$ represents a difference between the absolute values of the piezoelectric constant $d_{31}$ measured at 10° C. and 40° C. Results of the measurement are shown in Table 7 in FIG. 17.

Next, similar to Examples 1 to 5, from the piezoelectric elements according to the present invention (Examples 15 to 20), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 15 to 20) were subjected to calculation of a number density (% by number) of crystal grains A each having the first domain and a number density (% by number) of crystal grains B each having the second domain. Results of the calculation and the measurement are shown in Table 6 in FIG. 16. The average equivalent circle diameters of crystal grains calculated as to the piezoelectric elements according to the present invention (Examples 15 to 20) were all equal to 2.8 μm.

In all of Examples 15 to 20, the average equivalent circle diameter of crystal grains was not smaller than 1.0 μm and not larger than 10 µm. Further, as shown in Table 6, in all of Examples 15 to 20, crystal grains A each having the first domain and crystal grains B each having the second domain were both present in an amount of not less than 5% by number, the absolute value of the piezoelectric constant $d_{31}$ under room temperature was not lower than 120 pm/V, and the mechanical quality factor $Q_m$ under room temperature was not lower than 600. Therefore, the piezoelectric elements of Examples 15 to 20 were each found to be easy to be expanded and contracted when vibrating, and small in elasticity loss caused by vibration, which means that they are suitable for use as a drive source. In particular, in a case where the value of the ratio x is not lower than 0.02 and not higher than 0.10, the absolute value of the piezoelectric constant $d_{31}$ under room temperature is not lower than 150 pm/V, and this range of values of the ratio x is preferable from the viewpoint of ease of expansion and contraction during vibration. Further, even in a case where the value of the ratio x is not lower than 0.10 and not higher than 0.20, the absolute value of the piezoelectric constant $d_{31}$ under room temperature is not lower than 130 pm/V, and the value of the piezoelectric constant change ratio is as low as less than 0.30, so that the piezoelectric element is preferable in that the ease of expansion and contraction during vibration is less dependent on the temperature. Further, it was known that in all of Examples 15 to 20, the value of the ratio x is lower than 0.30 and the relative content of Ca is low, and hence the sintering temperature can be set to a value not higher than 1400° C., which is preferable from the viewpoint of ease of manufacturing.

Next, Examples 21 and 25 will be described. First, the same raw material powders as used in Examples 1 to 5 were mixed after weighing such that the amounts of Ba, Ca, Ti, Zr, and Mn satisfied the composition of the above Formula (1) in which x=0.13, z=0.002, and a=0.9955. At this time, the amounts of Ba, Ca, Ti, Zr, and Mn were adjusted such that the ratio y in the above Formula (1) became equal to one of values shown in Table 8 in FIG. 18. Further, to adjust the ratio a in the above Formula (1), proper amounts of barium carbonate and titanium oxide were added. The mixture of these raw material powders was dry-mixed in the ball mill for 24 hours to prepare a mixed powder. Thereafter, disk-shaped ceramics (Examples 21 to 25) were prepared by the same procedure as used for Examples 6 to 10.

Next, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Thereafter, the composition of each of all the disk-shaped ceramics was evaluated by X-ray fluorescence analysis. As a result, it was found that the evaluated composition matched the weighed composition. Further, the content of a Pb component in each of the disk-shaped ceramics (Examples 21 to 25) was less than 1000 ppm.

Next, similar to Examples 1 to 5, piezoelectric elements according to the present invention (Examples 21 to 25) were each made by preparing a strip-shaped piezoelectric element from each disk-shaped ceramic, and subjecting the strip-shaped piezoelectric element to the first polarization treatment and then to the second polarization treatment, in the same manner as in the case of Examples 15 to 20. Then, similar to Examples 1 to 5, the measurement of the piezoelectric constant $d_{31}$ and the mechanical quality factor $Q_m$ under room temperature was performed. Results of the measurement are shown in Table 8 in FIG. 18.

Next, the piezoelectric elements according to the present invention (Examples 21 to 25) were each placed in a thermostat bath (SH-261 manufactured by ESPEC Corp.), and while changing the ambient temperature in the thermostat bath, temperature dependency of the dielectric constant of each piezoelectric element was measured by the parallel-plate capacitor method, and a Curie temperature $T_C$ was determined. In doing this, an AC electric field with a frequency of 1 kHz and an electric field strength of 10 V/cm was applied to each piezoelectric element. The temperature of the thermostat bath was changed from room temperature to 150 5° C. at a rate of 5° C./minute, and after the change, the temperature was held for 5 minutes. Results of the measurement and the calculation are shown in Table 8 in FIG. 18.

Next, similar to Examples 1 to 5, from the piezoelectric elements according to the present invention (Examples 21 to 25), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 21 to 25) were subjected to calculation of a number density (% by number) of crystal grains A each having the first domain and a number density (% by number) of crystal grains B each having the second domain. Results of the calculation and the measurement are shown in Table 8 in FIG. 18. The average equivalent circle diameters of crystal grains calculated as to the piezoelectric elements according to the present invention (Examples 21 to 25) were all equal to 2.8 µm.

In all of Examples 21 to 25, the average equivalent circle diameter of crystal grains was not smaller than 1.0 µm and not larger than 10 µm. Further, as shown in Table 8, in all of Examples 21 to 25, crystal grains A each having the first domain and crystal grains B each having the second domain were both present in an amount of not less than 5% by number, the absolute value of the piezoelectric constant $d_{31}$ under room temperature was not lower than 110 pm/V, and the mechanical quality factor $Q_m$ under room temperature was not lower than 800. Therefore, the piezoelectric elements of Examples 21 to 25 were each found to be easy to be expanded and contracted when vibrating, and small in elasticity loss caused by vibration, which means that they are suitable for use as a drive source. In particular, in a case where the value of the ratio y is not lower than 0.010 and not higher than 0.095, the absolute value of the piezoelectric constant $d_{31}$ under room temperature is not lower than 120 pm/V, and also the Curie temperature $T_C$ is not lower than 100° C., and hence this range of values of the ratio y is more desirable from the viewpoint of piezoelectric characteristics.

Next, Examples 26 to 31 will be described. First, the same raw material powders as used in Examples 1 to 5 were mixed after weighing such that the amounts of Ba, Ca, Ti, Zr, and Mn satisfied the composition of the above Formula (1) in which x=0.14, y=0.050, and a=0.9955. At this time, the amounts of Ba, Ca, Ti, Zr, and Mn were adjusted such that the ratio z in the above Formula (1) became equal to one of values shown in Table 9 in FIG. 19. Further, to adjust the ratio a in the above Formula (1), proper amounts of barium carbonate and titanium oxide were added. The mixture of these raw material powders was dry-mixed in the ball mill for 24 hours to prepare a mixed powder. Thereafter, disk-shaped ceramics (Examples 26 to 31) were prepared by the same procedure as used for Examples 6 to 10.

Next, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Thereafter, similar to Examples 1 to 5, the composition of each of all the disk-shaped ceramics was evaluated by X-ray fluorescence analysis. As a result, it was found as to each disk-shaped ceramic that the evaluated composition matched the weighed composition. Further, the content of a Pb component in each of the disk-shaped ceramics (Examples 26 to 31) was less than 1000 ppm.

Thereafter, similar to Examples 1 to 5, piezoelectric elements according to the present invention (Examples 26 to 31) were each made by preparing a strip-shaped piezoelectric element from each disk-shaped ceramic, and subjecting the strip-shaped piezoelectric element to the first polarization treatment and then to the second polarization treatment, in the same manner as in the case of Examples 15 to 20. Then, similar to Examples 1 to 5, the measurement of the piezoelectric constant $d_{31}$ and the mechanical quality factor $Q_m$ of the piezoelectric elements according to the present invention under room temperature was performed. Results of the measurement are shown in Table 9 in FIG. 19.

Next, from the piezoelectric elements according to the present invention (Examples 26 to 31), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 26 to 31) were subjected to calculation of a number density (% by number) of crystal grains A each having the first domain and a number density (% by number) of crystal grains B each having the second domain. Results of the calculation and the measurement are shown in Table 9 in FIG. 19. The average equivalent circle diameters of crystal grains calculated as to the piezoelectric elements according to the present invention (Examples 26 to 31) were all equal to 2.8 µm.

In all of Examples 26 to 31, the average equivalent circle diameter of crystal grains was not smaller than 1.0 µm and not larger than 10 µm. Further, as shown in Table 9, in all of Examples 26 to 31, crystal grains A each having the first domain and crystal grains B each having the second domain were both present in an amount of not less than 5% by number, the absolute value of the piezoelectric constant $d_{31}$ under room temperature was not lower than 130 pm/V, and the mechanical quality factor $Q_m$ under room temperature was not lower than 1000. Therefore, the piezoelectric elements of Examples 26 to 31 were each found to be easy to be expanded and contracted when vibrating, and small in elasticity loss caused by vibration, which means that they are suitable for use as a drive source. In particular, in a case where the value of the ratio z is not lower than 0.003 and not higher than 0.012, the mechanical quality factor $Q_m$ under room temperature is not lower than 1200, and hence this range of values of the z is more desirable from the viewpoint of suppression of elasticity loss.

Next, Examples 32 to 37 will be described. First, the same raw material powders as used in Examples 1 to 5 were mixed after weighing such that the amounts of Ba, Ca, Ti, Zr, and Mn satisfied the composition of the above Formula (1) in which x=0.15, y=0.060, z=0.006, and a=0.9955. At this time, as to Examples 32 to 36, bismuth oxide ($Bi_2O_3$, purity of not lower than 99.99%) was used as a raw material powder. This raw material powder was added after weighing such that the content (mole) of Bi relative to the sum of A (mole) and B (mole) in the above Formula (1) became equal to one of values shown in Table 10 in FIG. 20. Further, to adjust the ratio a in the above Formula (1), proper amounts of barium carbonate and titanium oxide were added. The mixture of these raw material powders was dry-mixed in the ball mill for 24 hours to prepare a mixed powder. Thereafter, disk-shaped ceramics (Examples 32 to 37) were prepared by the same procedure as used for Examples 6 to 10.

Next, similar to Examples 1 to 5, the crystal structure of each disk-shaped ceramic was analyzed by X-ray diffraction at an ambient temperature of 25° C. As a result, only peaks attributable to a tetragonal perovskite structure were observed. Thereafter, similar to Examples 1 to 5, the composition of each of all the disk-shaped ceramics was evaluated by X-ray fluorescence analysis. As a result, it was found as to each disk-shaped ceramic that the evaluated composition matched the weighed composition. Further, the content of a Pb component in each of the disk-shaped ceramics (Examples 32 to 37) was less than 1000 ppm.

Thereafter, similar to Examples 1 to 5, piezoelectric elements according to the present invention (Examples 32 to 37) were each made by preparing a strip-shaped piezoelectric element from each disk-shaped ceramic, and subjecting the strip-shaped piezoelectric element to the first polarization treatment and then to the second polarization treatment, in the same manner as in the case of Examples 15 to 20. Then, similar to Examples 1 to 5, the measurement of the piezoelectric constant $d_{31}$ and the mechanical quality factor $Q_m$ of the piezoelectric elements according to the present invention under room temperature was performed. Results of the measurement are shown in Table 10 in FIG. 20.

Next, the piezoelectric elements according to the present invention (Examples 32 to 37) were each placed in the thermostat bath (SH-261 manufactured by ESPEC Corp.), and while changing ambient temperature in the thermostat bath, temperature dependency of the dielectric constant of each piezoelectric element was measured by the parallel-plate capacitor method, and a Curie temperature $T_C$ was determined. In doing this, an AC electric field with a frequency of 1 kHz and an electric field strength of 10 V/cm was applied to each piezoelectric element. The temperature of the thermostat bath was changed from room temperature to 150° C. at a rate of 5° C./minute, and after the change, the temperature was held for 5 minutes. Results of the measurement and the calculation are shown in Table 10 in FIG. 20.

Next, the piezoelectric elements according to the present invention (Examples 32 to 37) were each placed in the thermostat bath (SH-261 manufactured by ESPEC Corp.), and while changing ambient temperature in the thermostat bath, the mechanical quality factor $Q_m$ of each piezoelectric element at a temperature of −30° C. (hereafter denoted as "$Q_{m, -30° C.}$") was measured by the resonance and anti-resonance method. In doing this, after the temperature of the piezoelectric element was changed to −30° C., the temperature was held for 5 minutes. Results of the measurement are shown in Table 10 in FIG. 20.

Next, similar to Examples 1 to 5, from the piezoelectric elements according to the present invention (Examples 32 to 37), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 32 to 37) were subjected to calculation of a number density (% by number) of crystal grains A each having the first domain and a number density (% by number) of crystal grains B each having the second domain. Results of the calculation and the measurement are shown in Table 10 in FIG. 20. The average equivalent circle diameters of crystal grains calculated as to the piezoelectric elements according to the present invention (Examples 32 to 37) were all equal to 2.8 μm.

In all of Examples 32 to 37, the average equivalent circle diameter of crystal grains was not smaller than 1.0 μm and not larger than 10 μm. Further, as shown in Table 10, in all of Examples 32 to 37, crystal grains A each having the first domain and crystal grains B each having the second domain were both present in an amount of not less than 5% by number, the absolute value of the piezoelectric constant $d_{31}$ under room temperature was not lower than 120 pm/V, and the mechanical quality factor $Q_m$ under room temperature was not lower than 1200. Therefore, the piezoelectric elements of Examples 32 to 37 were each found to be easy to be expanded and contracted when vibrating, and small in elasticity loss caused by vibration, which means that they are suitable for use as a drive source. In particular, in a case where Bi/(A+B) is not lower than 0.15 mole % and not higher than 0.41 mole %, the mechanical quality factor $Q_m$ at −30° C. ($Q_{m,-30° C.}$) is not lower than 350, and hence, it was found that elasticity loss at low temperatures can be suppressed.

Next, Examples 38 to 42 will be described. First, the same raw material powders as used in Examples 1 to 5 were mixed after weighing such that the amounts of Ba, Ca, Ti, Zr, and Mn satisfied the composition of the above Formula (1) in which x=0.06, y=0.030, and z=0.008. Further, proper amounts of barium carbonate and titanium oxide were added such that the ratio a in the above Formula (1) became equal to one of values shown in Table 11 in FIG. 21. Then, the mixture of these raw material powders was dry-mixed in the ball mill for 24 hours to prepare a mixed powder, and a disk-shaped green compact was prepared by the same procedure as used for Examples 1 to 5. Then, the prepared green compact was placed in the electric furnace, and first heated in an air atmosphere by holding the temperature at 600° C., whereafter the temperature was raised to a selected one of sintering temperatures shown in Table 11 in FIG. 21 and held at the sintering temperature over 4.5 hours. Subsequently, the green compact was cooled to room temperature by natural cooling. Thus, disk-shaped ceramics (Examples 38 to 42) were each prepared as the piezoelectric material.

Next, a measured density of each disk-shaped ceramic at room temperature (25° C.) was evaluated by the Archimedes method. Further, a relative density of each disk-shaped ceramic was evaluated by using a theoretical density calculated from lattice constants determined by X-ray diffractometry and the weighed composition, and the measured density evaluated by the Archimedes method. The relative density thus obtained on each of Examples 38 to 42 are shown in Table 11 in FIG. 21.

Then, similar to Examples 1 to 5, the crystal structure of each disk-shaped ceramic was analyzed by X-ray diffractometry at an ambient temperature of 25° C. As a result, only peaks attributable to a tetragonal perovskite structure were observed. Thereafter, the composition of each of all the disk-shaped ceramics was evaluated by X-ray fluorescence analysis. As a result, it was found that the evaluated composition matched the weighed composition. Further, the content of a Pb component in each of the disk-shaped ceramics (Examples 38 to 42) was less than 1000 ppm.

Thereafter, similar to Examples 1 to 5, piezoelectric elements according to the present invention (Examples 38 to 42) were each made by preparing a strip-shaped piezoelectric element from each disk-shaped ceramic, and subjecting the strip-shaped piezoelectric element to the first polarization treatment and then to the second polarization treatment. However, in the first polarization treatment, the time period over which the DC voltage was to be applied was set to 100 minutes, and in the second polarization treatment, a DC voltage was applied to the gold electrodes such that an electric field having an electric field strength of 650 V/mm was generated in the ceramic in a direction opposite to the direction of the first polarization treatment over 13 minutes. Then, similar to Examples 1 to 5, the measurement of the piezoelectric constant $d_{31}$ and the mechanical quality factor $Q_m$, under room temperature, of the piezoelectric elements according to the present invention was performed. Results of the measurement are shown in Table 11 in FIG. 21.

Next, similar to Examples 1 to 5, from the piezoelectric elements according to the present invention (Examples 38 to 42), cross-section samples for observing crystal grains and domains were prepared by the same procedure as used for Examples 1 to 5, an average equivalent circle diameter of crystal grains in each cross-section sample was calculated, and widths of domains were measured. At this time, similar to Examples 6 to 10, the piezoelectric elements according to the present invention (Examples 38 to 42) were subjected to calculation of a number density (% by number) of crystal grains A each having the first domain and a number density (% by number) of crystal grains B each having the second domain. Results of the calculation and the measurement are shown in Table 11 in FIG. 21.

As shown in Table 11, in all of Examples 38 to 42, the average equivalent circle diameter of crystal grains was not smaller than 1.0 μm and not larger than 10 μm. Further, in all of Examples 38 to 42, crystal grains A each having the first domain and crystal grains B each having the second domain were both present in an amount of not less than 5% by number, the absolute value of the piezoelectric constant $d_{31}$ under room temperature was not lower than 80 pm/V, and the mechanical quality factor $Q_m$ under room temperature was not lower than 600. Therefore, the piezoelectric elements of Examples 38 to 42 were each found to be easy to be expanded and contracted when vibrating, and small in elasticity loss caused by vibration, which means that they are suitable for use as a drive source. In particular, in a case where the ratio a is not lower than 0.98 and not higher than 1.01, the relative density was not lower than 95%, and the sintering temperature can be set to lower than 1500° C., and hence, it was found that this range of values of the ratio a is desirable from the viewpoint of ease of manufacturing.

Next, Example 43 will be described. Using the piezoelectric element of Example 2 described above, the vibration wave motor 400 described above was made as Example 43. It was confirmed that application of an AC voltage caused the output shaft 403 of this vibration wave motor 400 to rotate. Further, Example 44 will be described. Using the vibration wave motor 400 of Example 43, the exchangeable lens barrel 500 described above was made as Example 44. It was confirmed that application of an AC voltage caused the exchangeable lens barrel 500 to perform an autofocus operation.

Next, Example 45 will be described. First, a titanium compound, a calcium compound, a zirconium compound, bismuth oxide ($Bi_2O_3$), and manganese oxide ($Mn_3O_4$) were mixed after weighing such that the amounts thereof satisfied the composition of Example 34 in Table 10 to give a mixture of raw material powders. Then, the mixture of these raw material powders was dry-mixed in the ball mill overnight to prepare a mixed powder. Then, PVB was added to and mixed with the mixed powder, and a green sheet having a thickness of 50 μm of the resulting mixture was prepared by the doctor blade method. Further, a conductive paste for the internal electrode was printed on the green sheet. A Pd paste was used as the conductive paste. Thereafter, 9 green sheets coated with the conductive paste were stacked to form a stacked body, and the temperature of the stacked body was raised to 1340° C., and held at 1340° C. for 5 hours to prepare a sintered body. Then, the sintered body was cut into a size of 10 mm×2.5 mm, and further, side surfaces of the cut sintered body were polished. Then, by Au sputtering, a pair of external electrodes for alternately short-circuiting layers of the internal electrode were formed on the side surfaces, and an upper electrode and a lower electrode connected to the pair of external electrodes, respectively, were formed on the top and bottom of the sintered body. Thus, the piezoelectric element 300 having the layered structure was made. When the internal electrode of the piezoelectric element 300 was observed, it was found that the plurality of layers of the internal electrode 302 made of Pd were formed alternately with the piezoelectric material layers 301. Then, the piezoelectric element 300 was subjected to polarization treatment, prior to evaluation of piezoelectric properties thereof. Specifically, as the first polarization treatment, the piezoelectric element 300 was heated to 100° C. in an oil bath, and a DC voltage was applied between the upper electrode 303 and the lower electrode 304 such that an electric field having an electric field strength of 1 kV/mm was generated, for 70 minutes, followed by allowing the temperature of the piezoelectric element 300 to be lowered to room temperature by natural cooling. Subsequently, as the second polarization treatment, the piezoelectric element 300 was heated to 75° C., and a DC voltage was applied between the upper electrode 303 and the lower electrode 304 such that an electric field having an electric field strength of 600 V/mm was generated in a direction opposite to the direction of the first polarization treatment for 10 minutes, followed by rapid cooling of the piezoelectric element 300. The piezoelectric properties of the piezoelectric element 300 thus made were evaluated, and it was confirmed that the piezoelectric element 300 has sufficient insulating properties and had excellent piezoelectric characteristics equal to those of the piezoelectric material of Example 1.

Next, Example 46 will be described. Using the piezoelectric element 300 of Example 45 described above, the vibration wave motor 407 described above was made as Example 46. It was confirmed that application of an AC voltage caused the rotor 410 of this vibration wave motor 407 to rotate. Further, Example 47 will be described. Using the vibration wave motor 407 of Example 46, the exchangeable lens barrel 500 described above was made. It was confirmed that application of an AC voltage caused the exchangeable lens barrel 500 to perform an autofocus operation. Further, Example 48 will be described. Using the piezoelectric element of Example 2, the digital camera 700 described above was made as Example 48. It was confirmed that the application of an AC voltage caused the digital camera 700 to perform a speaker operation.

Next, Example 47 will be described. Using the piezoelectric element 300 of Example 45, the piezoelectric actuator 10011 was made as Example 47. Using the piezoelectric actuator 10011, the ultrasonic probe 1001 shown in FIG. 8A was made. It was confirmed that an electric signal input to the ultrasonic probe 1001 caused the ultrasonic probe 1001 to transmit ultrasonic waves and receive reflected ultrasonic waves from a test object. Further, using the ultrasonic probe 1001, the ultrasonic inspection apparatus shown in FIG. 8B was made. It was confirmed that from vibration data output and input to the ultrasonic inspection apparatus, an ultrasonic wave image reduced in noise was generated.

The piezoelectric material according to the present invention is capable of exhibiting excellent and stable piezoelectric properties over a wide operating temperature range. Further, since no lead is contained, it is possible to reduce load on the environment. Further, the piezoelectric material according to the present invention can be used in devices and apparatuses, such as the vibration wave motor, the optical apparatuses including the vibration wave motor, and the electronic apparatuses, in which the piezoelectric material is used in a considerable quantity, without any problem.

While the present invention has been described with reference to exemplary embodiments, it is to be understood that the present invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-149962, filed Aug. 2, 2017 and Japanese Patent Application No. 2018-142935, filed Jul. 30, 2018, which are hereby incorporated by reference herein in their entirety.

What is claimed is:

1. A piezoelectric material comprising a plurality of crystal grains containing Ba, Ca, Ti, Zr, Mn, and O,
   wherein an average equivalent circle diameter of the crystal grains is not smaller than 1.0 μm and not larger than 10 μm, and
   wherein the crystal grains include crystal grains A each having a first domain with a width of not smaller than 300 nm and not larger than 800 nm, and crystal grains B each having a second domain with a width of not smaller than 20 nm and not larger than 50 nm.

2. The piezoelectric material according to claim 1, wherein the crystal grains A each having the first domain are present in an amount of not less than 5% by number and the crystal grains B each having the second domain are present in an amount of not less than 5% by number.

3. The piezoelectric material according to claim 1, wherein the crystal grains A include crystal grains A each having both of the first domain and the second domain.

4. The piezoelectric material according to claim 1, wherein the crystal grains B include crystal grains B each having both of the first domain and the second domain.

5. The piezoelectric material according to claim 1, wherein the first domain includes a first domain that extends across a grain boundary between adjacent crystal grains.

6. The piezoelectric material according to claim 1, wherein a content of a Pb component is less than 1000 ppm.

7. The piezoelectric material according to claim 1, wherein x indicative of a ratio of the number of moles of the contained Ca to the sum of the numbers of moles of the contained Ba and Ca is $0.02 \leq x \leq 0.30$.

8. The piezoelectric material according to claim 1, wherein y indicative of a ratio of the number of moles of the contained Zr to the sum of the numbers of moles of the contained Ti, Zr, and Mn is $0.01 \leq y \leq 0.095$.

9. A piezoelectric element including electrodes and a piezoelectric material member,
   wherein a piezoelectric material forming the piezoelectric material member comprises a plurality of crystal grains containing Ba, Ca, Ti, Zr, Mn, and O,
   wherein an average equivalent circle diameter of the crystal grains is not smaller than 1.0 μm and not larger than 10 μm, and wherein the crystal grains include crystal grains A each having a first domain with a width of not smaller than 300 nm and not larger than 800 nm, and crystal grains B each having a second domain with a width of not smaller than 20 nm and not larger than 50 nm.

10. The piezoelectric element according to claim 9, wherein layers of the piezoelectric member and the electrodes are alternately stacked.

11. A vibration wave motor including a vibration member having a piezoelectric element disposed therein, and a moving member,
the piezoelectric element including electrodes and a piezoelectric material member,
wherein a piezoelectric material forming the piezoelectric material member comprises a plurality of crystal grains containing Ba, Ca, Ti, Zr, Mn, and O,
wherein an average equivalent circle diameter of the crystal grains is not smaller than 1.0 μm and not larger than 10 μm, and
wherein the crystal grains include crystal grains A each having a first domain with a width of not smaller than 300 nm and not larger than 800 nm, and crystal grains B each having a second domain with a width of not smaller than 20 nm and not larger than 50 nm.

12. An optical apparatus including a drive section,
wherein the drive section includes a vibration wave motor,
the vibration wave motor including a vibration member having a piezoelectric element disposed therein, and a moving member,
the piezoelectric element including electrodes and a piezoelectric material member,
wherein a piezoelectric material forming the piezoelectric material member comprises a plurality of crystal grains containing Ba, Ca, Ti, Zr, Mn, and O,
wherein an average equivalent circle diameter of the crystal grains is not smaller than 1.0 μm and not larger than 10 μm, and
wherein the crystal grains include crystal grains A each having a first domain with a width of not smaller than 300 nm and not larger than 800 nm, and crystal grains B each having a second domain with a width of not smaller than 20 nm and not larger than 50 nm.

13. An electronic apparatus including a piezoelectric element,
the piezoelectric element including electrodes and a piezoelectric material member,
wherein a piezoelectric material forming the piezoelectric material member comprises a plurality of crystal grains containing Ba, Ca, Ti, Zr, Mn, and O,
wherein an average equivalent circle diameter of the crystal grains is not smaller than 1.0 μm and not larger than 10 μm, and
wherein the crystal grains include crystal grains A each having a first domain with a width of not smaller than 300 nm and not larger than 800 nm, and crystal grains B each having a second domain with a width of not smaller than 20 nm and not larger than 50 nm.

* * * * *